(12) United States Patent
Ichinose

(10) Patent No.: US 8,841,065 B2
(45) Date of Patent: Sep. 23, 2014

(54) MANUFACTURING METHOD OF EXPOSURE APPARATUS AND DEVICE MANUFACTURING METHOD

(75) Inventor: Go Ichinose, Fukaya (JP)

(73) Assignee: Nikon Corporation, Tokyo (JP)

( * ) Notice: Subject to any disclaimer, the term of this patent is extended or adjusted under 35 U.S.C. 154(b) by 736 days.

(21) Appl. No.: 13/022,922

(22) Filed: Feb. 8, 2011

(65) Prior Publication Data

US 2011/0200944 A1 Aug. 18, 2011

Related U.S. Application Data

(60) Provisional application No. 61/303,746, filed on Feb. 12, 2010.

(51) Int. Cl.
*G03F 7/20* (2006.01)

(52) U.S. Cl.
CPC ........ *G03F 7/70833* (2013.01); *G03F 7/70975* (2013.01); *G03F 7/70825* (2013.01)
USPC ............................................. 430/311; 355/53

(58) Field of Classification Search
CPC ............ G03F 7/70258; G03F 7/70733; G03F 7/70825; G03F 7/70975; G03F 7/26; G03F 7/70833; G03F 7/70; G03F 9/7096
USPC .................................. 430/311; 355/53; 29/464
See application file for complete search history.

(56) References Cited

U.S. PATENT DOCUMENTS

| 5,196,745 | A | 3/1993 | Trumper |
|---|---|---|---|
| 5,243,195 | A | 9/1993 | Nishi |
| 5,969,441 | A | 10/1999 | Loopstra et al. |
| 6,208,407 | B1 | 3/2001 | Loopstra |
| 6,590,634 | B1 | 7/2003 | Nishi et al. |
| 6,611,316 | B2 | 8/2003 | Sewell |
| 6,690,450 | B2 | 2/2004 | Nishi |
| 6,778,257 | B2 | 8/2004 | Bleeker et al. |
| 6,891,603 | B2 | 5/2005 | Nishi |
| 6,952,253 | B2 | 10/2005 | Lof et al. |
| 7,023,610 | B2 | 4/2006 | Ohtsuki et al. |
| 7,126,689 | B2 | 10/2006 | Nishi |
| 2001/0015795 | A1 | 8/2001 | Nishi |

(Continued)

FOREIGN PATENT DOCUMENTS

| EP | 1 220 037 A2 | 7/2002 |
|---|---|---|
| EP | 1 420 298 A2 | 5/2004 |

(Continued)

OTHER PUBLICATIONS

International Search Report issued in International Patent Application No. PCT/JP2011/053432 dated Aug. 19, 2011.

(Continued)

*Primary Examiner* — Caleen Sullivan
(74) *Attorney, Agent, or Firm* — Oliff PLC

(57) ABSTRACT

A manufacturing method of an exposure apparatus includes adjusting a positioning device that determines a positional relation at the time of docking between a body and a stage module such that a positional relation between an absolute reference surface of a metrology frame of the body and a stage position reference surface of the stage module becomes a desired relation. Accordingly, after that, only by docking the body and the stage module with each other via the positioning device, the positional relation between the absolute reference surface of the body and the stage position reference surface of the stage module becomes a desired relation.

68 Claims, 7 Drawing Sheets

(56) References Cited

U.S. PATENT DOCUMENTS

| | | |
|---|---|---|
| 2002/0085190 A1 | 7/2002 | Nishi |
| 2003/0025890 A1 | 2/2003 | Nishinaga |
| 2007/0206170 A1 | 9/2007 | Ebihara |
| 2007/0288121 A1 | 12/2007 | Shibazaki |
| 2008/0068568 A1 | 3/2008 | Ebihara et al. |
| 2008/0088843 A1 | 4/2008 | Shibazaki |

FOREIGN PATENT DOCUMENTS

| | | |
|---|---|---|
| EP | 1 975 980 A1 | 10/2008 |
| JP | A-2000-058420 | 2/2000 |
| WO | WO 01/35168 A1 | 5/2001 |
| WO | WO 2004/055803 A1 | 7/2004 |

OTHER PUBLICATIONS

Written Opinion issued in International Patent Application No. PCT/JP2011/053432 dated Aug. 19, 2011.

International Search Report issued in International Patent Application No. PCT/JP2011/053432 dated Aug. 23, 2011.

Written Opinion issued in International Patent Application No. PCT/JP2011/053432 dated Aug. 23, 2011.

MANUFACTURING METHOD OF EXPOSURE APPARATUS AND DEVICE MANUFACTURING METHOD

CROSS-REFERENCE TO RELATED APPLICATIONS

This non-provisional application claims the benefit of Provisional Application No. 61/303,746 filed Feb. 12, 2010, the disclosure of which is hereby incorporated herein by reference in its entirety.

BACKGROUND OF THE INVENTION

1. Field of the Invention

The present invention relates to manufacturing methods of exposure apparatuses and device manufacturing methods, and more particularly to a manufacturing method of an exposure apparatus to manufacture an exposure apparatus that exposes a sensitive object, used in a lithography process for manufacturing microdevices (electron devices), and a device manufacturing method that uses the exposure apparatus manufactured with the manufacturing method of the exposure apparatus. In this case, manufacturing of the exposure apparatus includes, in addition to manufacturing (including assembly) in a plant of a manufacturer and manufacturing (assembly at the time of starting-up) in a plant of a user that is a destination of shipment, assembly needed when the apparatus is moved and installed. In the present specification, the manufacturing of the exposure apparatus is used in such meanings.

2. Description of the Background Art

Conventionally, in a lithography process for manufacturing microdevices (electron devices) such as semiconductor devices or liquid crystal display elements, various types of exposure apparatuses including a projection exposure apparatus such as a stepper or a scanning stepper are used.

In a conventional exposure apparatus such as a stepper, a configuration capable of performing high-precision positioning or high-precision scanning has been employed for a reticle stage system that positions a reticle and for a wafer stage system that two-dimensionally moves a wafer. And, in this type of exposure apparatus, a projection optical system is installed to a frame device (body), and further each of the stage systems is sequentially assembled directly to the frame device.

However, with a method of sequentially assembling each of the stage systems and the like to the frame device in this manner, there is the inconvenience such as requiring a time for assembly adjustment and also requiring a long time for adjustment and the like of the relative position between each of the stage systems and the projection optical system. As measures to be taken in order to address such inconvenience and make improvement, an exposure apparatus has been previously proposed (refer to U.S. Patent Application Publication No. 2001/0015795), in which a first stage chamber that houses a first stage system moving while holding a first object (reticle) and is installed detachable with respect to a frame device, and a second stage chamber that houses a second stage system moving while holding a second object (wafer) and is installed detachable with respect to the frame device, each have a module configuration, and after the first stage chamber and the second stage chamber are assembled, the stage chambers are installed to the frame device, and thereby assembly of the exposure apparatus can be performed without difficulty and speedily.

In the case of employing such a module configuration, when the modules are carried into the frame device, it is more desirable that the positional relation between the modules and the frame device is maintained in a desired state.

SUMMARY OF THE INVENTION

According to a first aspect of the present invention, there is provided a first manufacturing method of an exposure apparatus to manufacture an exposure apparatus that comprises a plurality of modules including a body and a first module to be docked with the body and exposes a sensitive object, the method comprising: adjusting a first positioning device provided between a body tool that is substantially a same member as the body to be shipped and the first module such that a positional relation between the body tool and the first module at the time of docking between them becomes a desired relation; shipping the first module whose positional relation at the time of the docking with the body tool via the first positioning device after the adjustment becomes the desired relation; and docking the body and the first module with each other via a second positioning device having a same configuration as the first positioning device, at a destination of shipment, the second positioning device being in a same state as the first positioning device after the adjustment and being provided between the body and the first module.

With this method, in the case of docking one of a plurality of first modules that are produced in large numbers and a body with each other at a destination of shipment, the positional relation between the body and the first module becomes a desired relation only by docking both of them via the second positioning device. Consequently, adjustment of the positional relation between the first module and the body becomes unnecessary on manufacturing (assembly) of the exposure apparatus at the destination of shipment.

According to a second aspect of the present invention, there is provided a second manufacturing method of an exposure apparatus to manufacture an exposure apparatus that comprises a plurality of modules including a body and a first module to be docked with the body and exposes a sensitive object, the method comprising: adjusting a first positioning device provided between a first module tool that is substantially a same member as the first module to be shipped and the body such that a positional relation between the first module tool and the body at the time of docking between them becomes a desired relation; shipping the body whose positional relation at the time of the docking with the first module tool via the first positioning device after the adjustment becomes the desired relation; and docking the body and the first module with each other via a second positioning device having a same configuration as the first positioning device, at a destination of shipment, the second positioning device being in a same state as the first positioning device after the adjustment and being provided between the first module and the body.

With this method, in the case of docking one of a plurality of bodies that are produced in large numbers and a first module with each other at a destination of shipment, the positional relation between the body and the first module becomes a desired relation only by docking both of them via the second positioning device. Consequently, adjustment of the positional relation between the first module and the body becomes unnecessary on manufacturing (assembly) of the exposure apparatus at the destination of shipment.

According to a third aspect of the present invention, there is provided a third manufacturing method of an exposure apparatus to manufacture an exposure apparatus that comprises a plurality of modules including a body and a first module to be docked with the body via a positioning device and exposes a sensitive object, the method comprising: adjusting the positioning device that determines a positional relation between the body and the first module at the time of docking between them such that a positional relation between a first reference surface of the body and a second reference surface of the first module becomes a desired relation.

With this method, after adjustment of the positioning device, e.g. after manufacturing of the exposure apparatus or the like, the positional relation between the first reference surface of the body and the second reference surface of the first module becomes a desired relation only by docking the body and the first module via the positioning device. Therefore, the bothersome work necessary for positioning of the first reference surface of the body and the second reference surface of the first module becomes unnecessary.

According to a fourth aspect of the present invention, there is provided a fourth manufacturing method of an exposure apparatus to manufacture an exposure apparatus that comprises a plurality of modules including a body and a first module to be docked with the body and exposes a sensitive object, the method comprising: prior to docking, at a destination of shipment, the body and the first module with each other in a desired relation via a first positioning device provided between the body and the first module, docking a body tool that is substantially a same member as the body to be shipped and the first module with each other via a second positioning device having a same configuration as the first positioning device, and on the docking, adjusting the second positioning device provided between the body tool and the first module such that a positional relation between the body tool and the first module becomes the desired relation; and shipping the first module after the adjustment.

According to a fifth aspect of the present invention, there is provided a fifth manufacturing method of an exposure apparatus to manufacture an exposure apparatus that comprises a plurality of modules including a body and a first module to be docked with the body and exposes a sensitive object, the method comprising: docking the body and the first module with each other in a desired relation via a first positioning device provided between the body and the first module and adjusted in advance, wherein the first positioning device is adjusted in advance similarly to a second positioning device having a same configuration as the first positioning device and adjusted when a body tool that is substantially a same member as the body and the first module are docked with each other via the second positioning device such that a positional relation between the body tool and the first module becomes the desired relation.

According to a sixth aspect of the present invention, there is provided a sixth manufacturing method of an exposure apparatus to manufacture an exposure apparatus that comprises a plurality of modules including a body and a first module to be docked with the body and exposes a sensitive object, the method comprising: prior to docking, at a destination of shipment, the body and the first module with each other in a desired relation via a first positioning device provided between the body and the first module, docking a first module tool that is substantially a same member as the first module to be shipped and the body with each other via a second positioning device having a same configuration as the first positioning device, and on the docking, adjusting the second positioning device provided between the first module tool and the body such that a positional relation between the body and the first module tool becomes the desired relation; and shipping the body after the adjustment.

According to a seventh aspect of the present invention, there is provided a seventh manufacturing method of an exposure apparatus to manufacture an exposure apparatus that comprises a plurality of modules including a body and a first module to be docked with the body and exposes a sensitive object, the method comprising: docking the body and the first module with each other in a desired relation via a first positioning device provided between the body and the first module and adjusted in advance, wherein the first positioning device is adjusted in advance similarly to a second positioning device having a same configuration as the first positioning device and adjusted when a first module tool that is substantially a same member as the first module and the body are docked with each other via the second positioning device such that a positional relation between the first module tool and the body becomes the desired relation.

According to the fourth to seventh manufacturing methods of the exposure apparatus, adjustment of the positional relation between the first module and the body becomes unnecessary on manufacturing (assembly) of the exposure apparatus at a destination of shipment (such as a plant of a user of the exposure apparatus).

According to another aspect of the present invention, there is provided a device manufacturing method, including: exposing a sensitive object using the exposure apparatus manufactured with any one of the first to seventh manufacturing methods of the exposure apparatus of the present invention; and developing the sensitive object that has been exposed.

BRIEF DESCRIPTION OF DRAWINGS

In the accompanying drawings.

DESCRIPTION OF EMBODIMENTS

Figure 1:
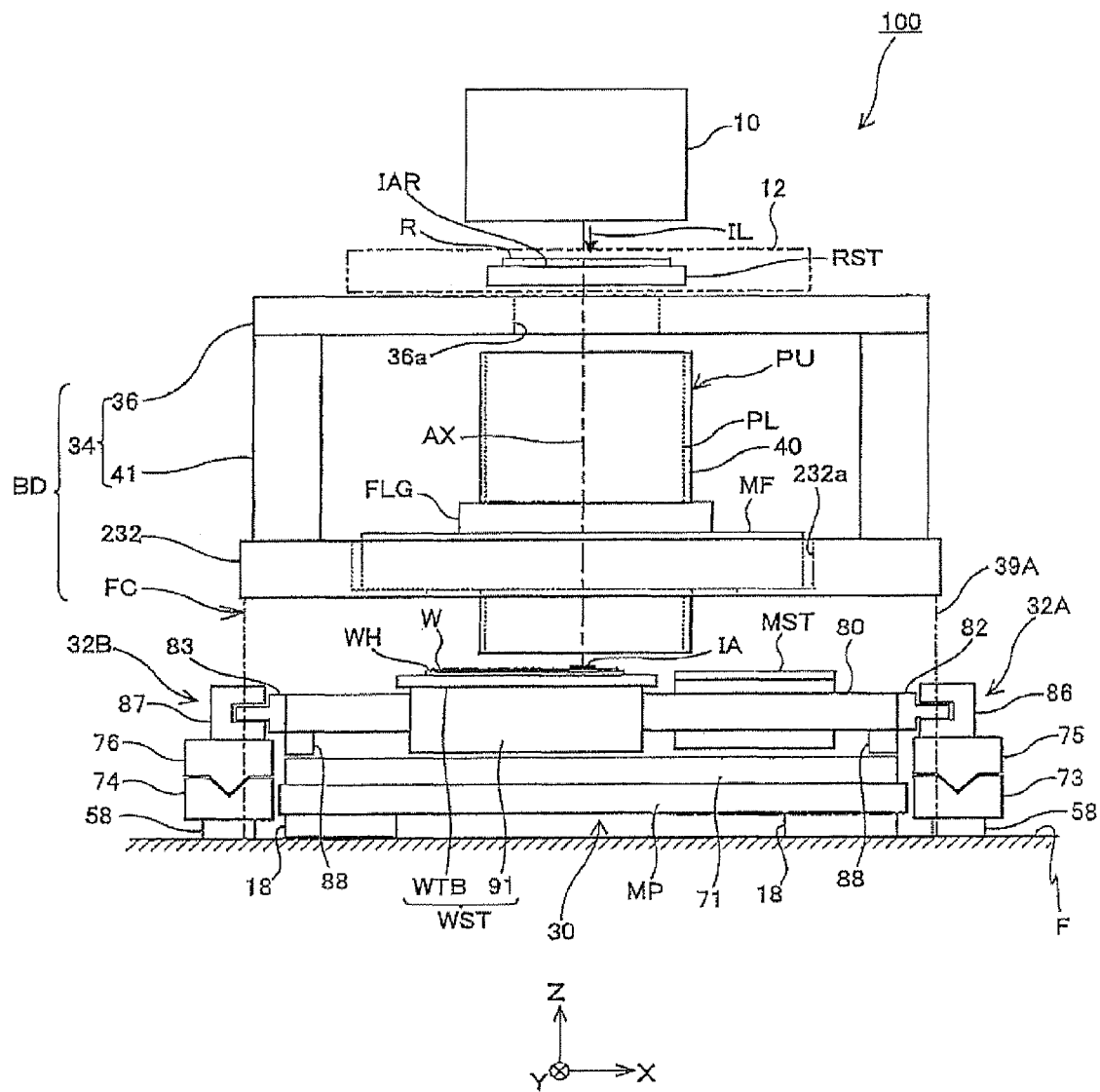
FIG. 1 is a view schematically showing a configuration of an exposure apparatus of an embodiment.

An embodiment of the present invention is described below, with reference to FIGS. 1 to 7. FIG. 1 shows a schematic configuration of an exposure apparatus 100 related to the embodiment. Exposure apparatus 100 is a projection exposure apparatus by a step-and-scan method (a so-called scanner). As is described later, a projection optical system PL is provided in the embodiment, and in the description below, the explanation is given assuming that a direction parallel to an optical axis AX of projection optical system PL is a Z-axis direction (Z direction), a direction in which a reticle and a wafer are relatively scanned within a plane orthogonal to the Z-axis direction is a Y-axis direction (Y direction), a direction orthogonal to the Z-axis and the Y-axis is an X-axis direction (X direction), and rotational (tilt) directions around the X-axis, Y-axis and Z-axis are $\theta x$, $\theta y$ and $\theta z$ directions, respectively.

Exposure apparatus 100 is equipped with an illumination system 10, including a light source and an illumination optical system, that illuminates a reticle R, with illumination light (exposure light) IL, a reticle stage module 12 including a reticle stage RST that holds reticle R, a projection unit PU that includes projection optical system PL, a body BD on which reticle stage module 12, projection unit PU and the like are mounted, a wafer stage module (hereinafter, shortly referred to as a stage module) 30 that includes a wafer stage WST on which a wafer W is mounted and a measurement stage MST, countermass modules 32A and 32B that are respectively placed on one side and the other side of stage module 30 in the X-axis direction, and their control system and the like.

Illumination system 10 includes a light source, an illuminance uniformity optical system including an optical integrator and the like, a beam splitter, a relay lens, a variable ND filter, a reticle blind and the like (none of which are illustrated), as disclosed in, for example, U.S. Patent Application Publication No. 2003/0025890 and the like. Illumination system 10 illuminates a slit-shaped illumination area IAR, which is defined by the reticle blind, on reticle R with illumination light IL with substantially uniform illuminance. In this case, as illumination light IL, ArF excimer laser light (wavelength: 193 nm) is used as an example.

Reticle stage module 12 is mounted on a reticle base 36 that is a part of body BD. Reticle stage module 12 is equipped with reticle stage RST, a reticle stage driving system (not illustrated) including a linear motor and the like that drives reticle stage RST, and the like. On reticle stage RST, reticle R is held by, for example, vacuum adsorption (or electrostatic adsorption). Reticle stage RST is driven with predetermined strokes in a predetermined scanning direction (in this case, the Y-axis direction being an orthogonal direction to the page surface of FIG. 1) on reticle base 36 and is also finely driven in the X-axis direction and the θz direction as needed, with the reticle stage driving system.

The position of reticle stage RST is constantly detected at a resolution of, for example, around 0.25 nm with a reticle laser interferometer that is not illustrated. Based on detection results of the reticle laser interferometer, a controller, not illustrated, drives (controls the position of) reticles stage RST via the reticle stage driving system. Incidentally, the position measurement of the reticle stage can also be performed by the encoder system that is disclosed in, for example, U.S. Patent Application Publication No. 2007/0288121 and the like.

Projection unit PU is placed below reticle stage RST in FIG. 1. Projection unit PU includes a barrel 40 and projection optical system PL held inside barrel 40. As projection optical system PL, for example, a dioptric system that is composed of a plurality of optical elements (lens elements) that are disposed along optical axis AX is used. Projection optical system PL is, for example, both-side telecentric and has a predetermined projection magnification (e.g. one-quarter, one-fifth, one-eighth times, or the like). Projection unit PU is integrally held by a member that is referred to as a metrology frame MF supported by a first frame 232, to be described later, that configures a part of body BD. To be more specific, metrology frame MF is also referred to as a barrel surface plate and has a circular opening (or a U-shaped cutout), not illustrated, formed in its substantially center portion. In the circular opening, projection unit PU is inserted from above (or from the depth side of the page surface), and projection unit FU is supported by metrology frame MF via a flange FLG fixed to an outer circumference portion of barrel 40.

Therefore, when illumination area IAR on reticle R is illuminated by illumination system 10, illumination light IL that has passed through reticle R whose pattern surface is placed substantially coincident with a first plane (object plane) of projection optical system FL forms a reduced image of a circuit pattern (a reduced image of a part of a circuit pattern) of reticle R within illumination area IAR, via projection optical system PL (projection unit PU), an area (hereinafter, also referred to as an exposure area) IA, which is conjugate to illumination area IAR described above, on wafer W which is placed on the second plane (image plane) side of projection optical system PL and whose surface is coated with a resist (sensitive agent). Then, by moving reticle R relative to illumination area IAR (illumination light IL) in the scanning direction (Y-axis direction) and also moving wafer W relative to exposure area IA (illumination light IL) in the scanning direction by synchronous drive of reticle stage RST and wafer stage WST, scanning exposure of one shot area (divided area) on wafer W is performed, and a pattern of reticle R is transferred onto the shot area. In other words, in the embodiment, a pattern of reticle R is generated on wafer W by illumination system 10 and projection optical system PL, and the pattern is formed on wafer W by exposure of a sensitive layer (resist layer) on wafer W with illumination light IL.

Body BD is equipped with first frame 232 mounted on a frame caster FC installed on a floor surface F of a clean room, and a column 34 fixed on first frame 232. Column 34 includes a plurality, e.g. three, of legs 41 (however, the illustration of the leg in the depth of the page surface in FIG. 1 is omitted) installed at positions surrounding projection unit PU on the upper surface of first frame 232, and reticle base 36 horizontally supported by three legs 41. At reticle base 36, an opening 36a that serves as a path of illumination light IL is formed in its center portion.

Frame caster FC is composed of a pair of wall members 39A and 39B placed apart in the Y-axis direction on floor surface F (wall member 39B in the depth of the page surface is not illustrated in FIG. 1, see FIG. 2), and first frame 232 is horizontally supported from below by the pair of wall members 39A and 39B. Note that, as is described later, an air hover is used in the embodiment, and therefore, in the case where floor surface F has a mesh structure or the like, it is necessary that a flat plate that is referred to as a base plate is installed on floor surface F, the pair of wall members 39A and 39B are placed apart in the Y-axis direction on the flat plate and frame caster FC is configured of the base plate and the pair of wall members 39A and 39B. In this case, each of the members placed on the floor surface or the frame caster is placed via a vibration isolation mechanism. Incidentally, metrology frame MF needs not to be a frame installed on the floor surface but can be a frame supported by suspension from the reticle base mounted on a main frame that is not illustrated, as disclosed in, for example, U.S. Patent Application Publication No. 2008/0068568 and the like.

First frame 232 is made up of a rectangular frame-shaped member parallel to the XY plane. First frame 232 has a recessed section 232a with a rectangular shape in a planar view in its center portion, and on the bottom wall of recessed section 232a, a circular or rectangular opening is formed in its center portion. Metrology frame MF is inserted from above in recessed section 232a and mounted on the bottom wall (frame-shaped portion) of recessed section 232a. Metrology frame MF is made up of a plate-shaped member with a rectangular shape in a planar view (or with a box shape with a low height) with the Y-axis direction serving as its longitudinal direction, and is fixed to first frame 232 via a vibration isolation device that is not illustrated, in a state parallel to the XY plane.

Incidentally, although not illustrated in the drawings, on the +Y side of projection unit PU, an off-axis alignment system (hereinafter, shortly referred to as an "alignment system"), for example, made up of an FIA (Field Image Alignment) system that is a type of an image-forming alignment sensor by an image processing method is arranged. This alignment system is fixed to the lower surface of metrology frame MF in a suspended state. Imaging signals from the alignment system are supplied to a controller that is not illustrated. In the alignment system, the detection method and type of the sensor may be arbitrary, and the sensor is not limited to the FIA system, but for example, an alignment sensor, which irradiates a coherent detection light on a subject mark and detects a scattered light or a diffracted light generated from the subject mark or makes two diffracted lights (e.g. diffracted lights of the same order or diffracted lights being diffracted in the same direction) generated from the subject mark interfere and detects an interference light, can naturally be used alone or in combination as needed.

Figure 2:
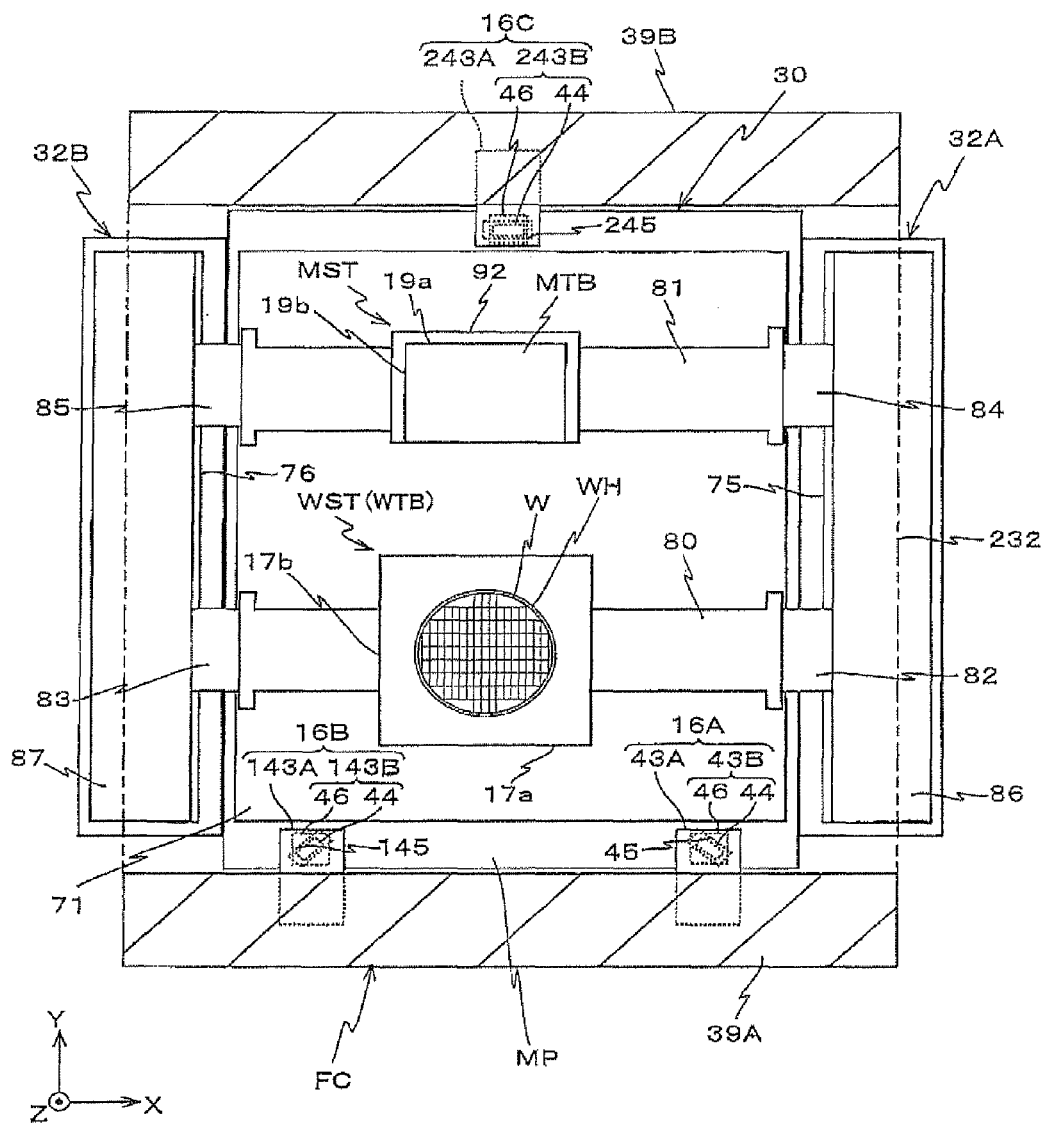
FIG. 2 is a plan view showing a stage module and counter-mass modules in FIG. 1.

FIG. 2 shows stage module 30 and countermass modules 32A and 32B, together with frame caster FC and first frame 232. As shown in FIGS. 2 and 1, stage module 30 has a flat plate (maintenance plate) MP, a stage base (stage surface plate) 71 mounted on flat plate MP, and wafer stage WST and measurement stage MST that move independently of each other along the upper surface of stage base 71.

Flat plate (maintenance plate) MP is horizontally supported on floor surface F via, for example, four levitation/elevating devices 18 placed corresponding to four corner portions of flat plate MP (two of four levitation/elevating devices 18 are shown in FIG. 1, and behind the two devices, the other two are hidden in the depth of the page surface). Configurations and the like of levitation/elevating devices 18 are described later in detail.

Flat plate MP is in a state positioned in each direction of the X-axis, the Y-axis, the Z-axis, the θx, the θy and the θz directions (directions of six degrees of freedom), by three positioning devices 16A to 16C shown in FIG. 2, with respect to body BD including first frame 232 and wall members 39A and 39B. Accordingly, stage base 71 (stage module 30) is in a state positioned in the directions of six degrees of freedom with respect to metrology frame MF.

Now, levitation/elevating devices 18 are described with reference to FIGS. 3A and 3B.

Figure 3A:
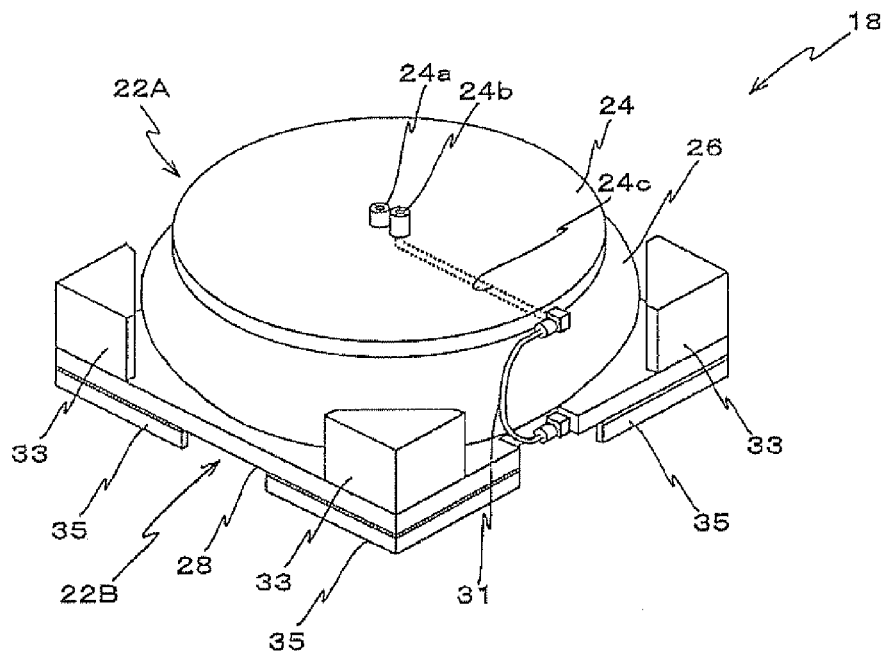
FIGS. 3A and 3B are perspective views showing a levitation/elevating device.

As shown in FIG. 3A, levitation/elevating devices 18 each include an air spring device 22A and a hover device 22B, as an example. Air spring device 22A has a plate-shaped member 24 with a circular plate shape and an air mount 26 arranged on the lower side of plate-shaped member 24, and the upper surface of plate-shaped member 24 is fixed to the lower surface of flat plate MP (see the drawings such as FIG. 4A). To air mount 26, a gas (e.g. a compressed gas) can be supplied via a first gas supply port 24a arranged at plate-shaped member 24, and air mount 26 expands/contracts with predetermined strokes (e.g. around 50 mm) in the Z-axis direction in accordance with a gas quantity filled in the inside (the variation in pressure of the compressed air). Therefore, in stage module 30, by vertically moving flat plate MP as needed using air spring device 22A (air mount 26) that each of a plurality of levitation/elevating devices 18 has, the position of the upper surface of stage base 71 in each of the Z-axis direction, the θx direction and the θy direction can arbitrarily be adjusted.

Figure 3B:
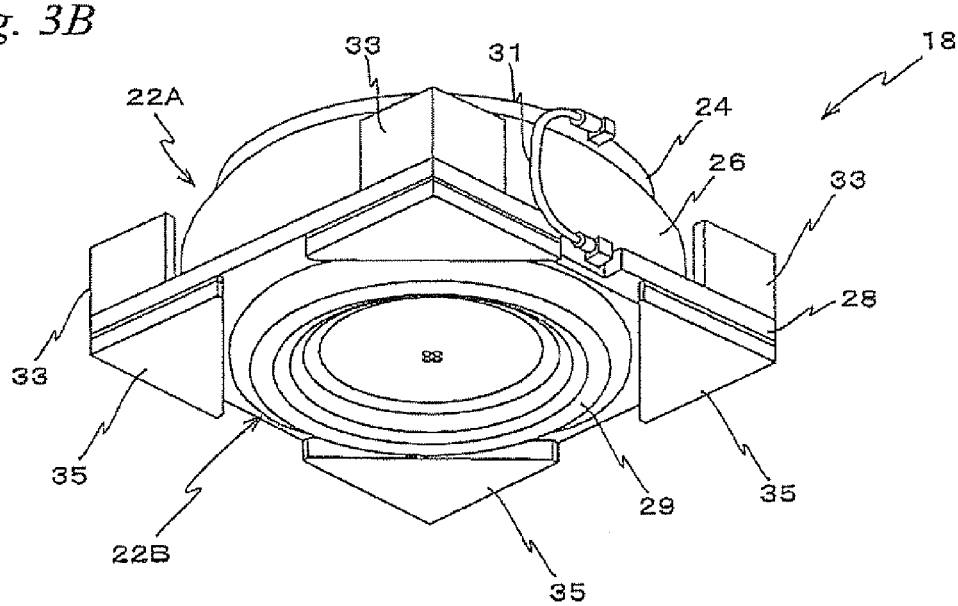

As shown in FIG. 3B, hover device 22B includes a base 28 that supports air mount 26 from the lower side and an air hover 29 arranged on the lower surface (−Z side surface) of base 28. To air hover 29, a compressed gas (e.g. compressed air) can be supplied via a second gas supply port 24b arranged at plate-shaped member 24 and a duct 24c formed in plate-shaped member 24 shown in FIG. 3A, and a piping 31 that communicates duct 24c and base 28 (in this case, this is another system different from air mount 26 described above), and when the compressed gas is jetted from air hover 29 to floor surface F (or the upper surface of the base plate), a predetermined spacing is formed between air hover 29 and floor surface F (or the base plate) owing to the jetting force (see FIG. 4C). Accordingly, stage module 30 as a whole can be levitated via a predetermined interspace (clearance/gap (e.g. around 10 mm)) above floor surface F.

Further, at each of four corner portions of the lower surface of base 28, a hover contact prevention member 35 with a triangular shape in a planar view when viewed from the −Z direction) is arranged. The width (height) in a height direction (Z-axis direction) of hover contact prevention member 35 is, as shown in the drawings such as FIG. 4A, set greater than the width (height) in the height direction (Z-axis direction) of air hover 29. Accordingly, even in the case where the compressed gas is not jetted from air hover 29, the lower surface of air hover 29 and floor surface F are maintained in a noncontact state.

Further, at each of four corner portions of the upper surface of base 28, a pillar member 33 is arranged (the pillar member located in the depth is not illustrated in FIGS. 3A and 3B). As shown in FIG. 4B, these pillar members 33 are members that support the empty weight of flat plate MP by coming in contact with the lower surface of flat plate MP, instead of air mount 26, when the gas inside air mount 26 is decreased.

Figure 4A:
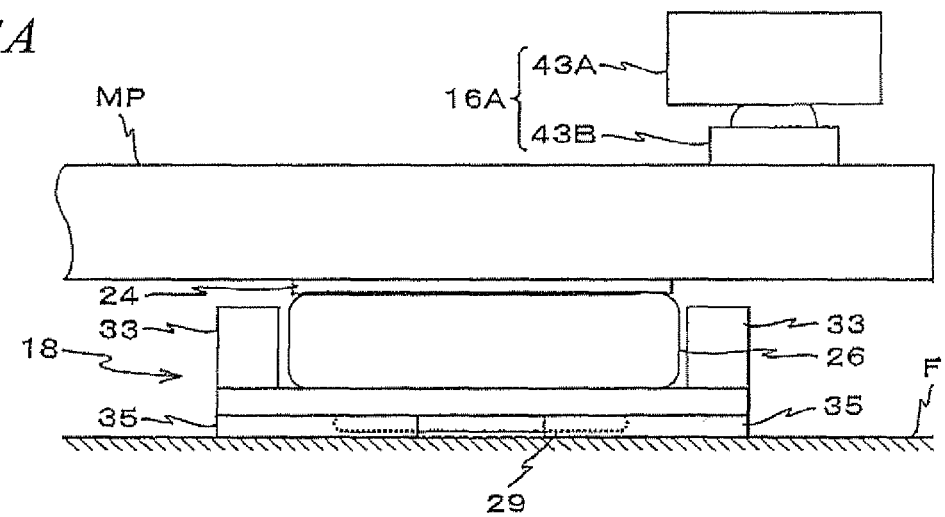
FIGS. 4A to 4C are views used to explain operations of the levitation/elevating device and a positioning device.
Figure 4B:
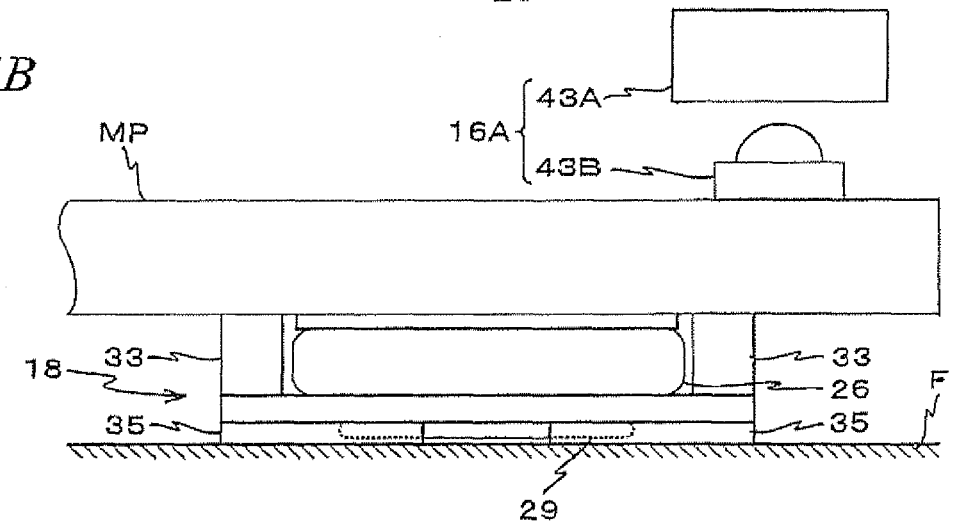
Figure 4C:
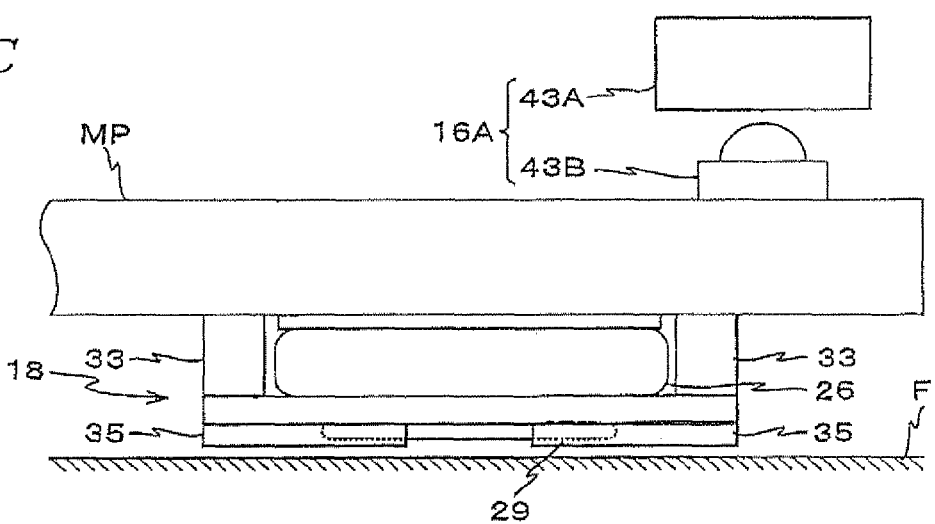

Levitation/elevating devices 18 configured as described above are to transit among the state shown in FIG. 4A, the state shown in FIG. 4B and the state shown in FIG. 4C. The respective states are described below.

The state shown in FIG. 4A is a state where air mount 26 is filled with the gas and the compressed gas is not supplied to air hover 29. In the state shown in FIG. 4A, hover contact prevention members 35 are in contact with floor surface F (hereinafter, this state is referred to as a "landing state"), while the lower surface of flat plate MP is not in contact with pillar members 33 (hereinafter, this state is referred to as an "ascending state"). In the description below, the state shown in FIG. 4A is to be referred to as a "first state".

Further, the state shown in FIG. 4B is a state where the gas inside air mount 26 is decreased (exhausted to the outside), and the compressed gas is not supplied to air hover 29. In the state shown in FIG. 4B, hover contact prevention members 35 are in the landing state described above, while the lower surface of flat plate MP is in contact with pillar members 33 (hereinafter, this state is referred to as a "descending state"). In the description below, the state shown in FIG. 46 is to be referred to as a "second state".

Further, the state shown in FIG. 4C is a state where the gas inside air mount 26 is decreased and the compressed gas is supplied to air hover 29. In the state shown in FIG. 4C, hover contact prevention members 35 are in a noncontact state with floor surface F (hereinafter, this state is referred to as a "levitating state"), while flat plate MP is in the descending state described above. In the description below, the state shown in FIG. 4C is to be referred to as a "third state".

Note that during the operation of the exposure apparatus (such as during exposure), levitation/elevating devices 18 are maintained in the first state shown in FIG. 4A.

Next, positioning devices 16A to 16C are described with reference to the drawings such as FIGS. 2, 5A and 5B.

As shown in FIG. 2, positioning device 16A is equipped with a first member 43A provided in a state where a −Y side half is inserted in a recessed section (not illustrated) with a predetermined depth having a rectangular shape elongated in the X-axis direction, when viewed from the +Y side, which is formed on the +Y side surface of wall member 39A that configures a part of frame caster FC, and a second member 43B fixed to the −Y side end of the upper surface of flat plate MP.

First member 43A is attached to the lower side wall surface that divides the recessed section, and a predetermined interspace is provided between first member 43A and the recessed section. As shown in FIG. 5A, first member 43A is made up of a roughly rectangular parallelepiped member and on its lower surface (−Z side surface), a V groove 45 having a roughly V-shaped cross section is formed. V groove 45 is formed along a direction intersecting the X-axis and the Y-axis within the XY plane. Further, position adjustment of first member 43A in the directions of six degrees of freedom (the X-axis, the Y-axis, the Z-axis, the θx, the θy and the θz directions) can be performed with respect to wall member 39A at the time of attachment.

Figure 5A:
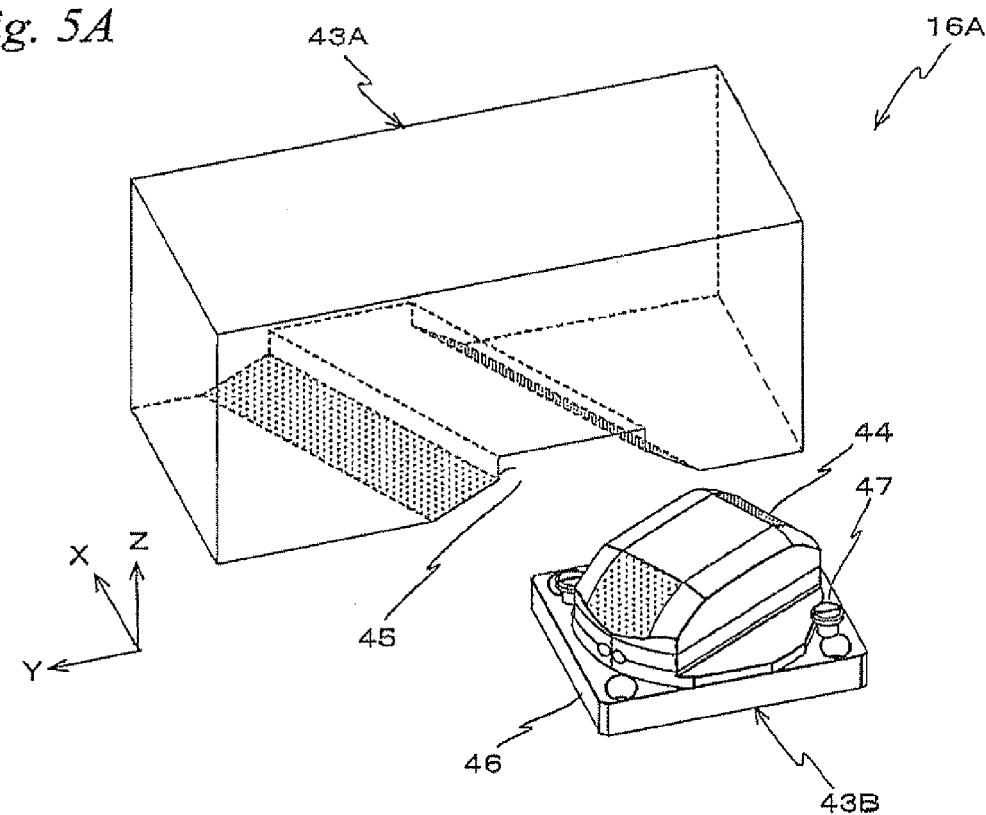
FIGS. 5A and 5B are views used to explain a configuration of a positioning device 16A.

As shown in FIG. 5A, second member 43B has a protruding section 44 having a roughly rectangular parallelepiped shape with rounded corner portions on the upper side of both ends in the longitudinal direction, and a foundation section 46 that supports protruding section 44 from the lower side. Protruding section 44 is configured rotatable in the θz direction with respect to foundation section 46, and in general, rotation adjustment is performed such that the longitudinal direction corresponds to a direction orthogonal to the longitudinal direction of V groove 45. And, protruding section 44 is fixed to foundation section 46 with a rotation lock 47 (the rotation is restricted).

Figure 5B:
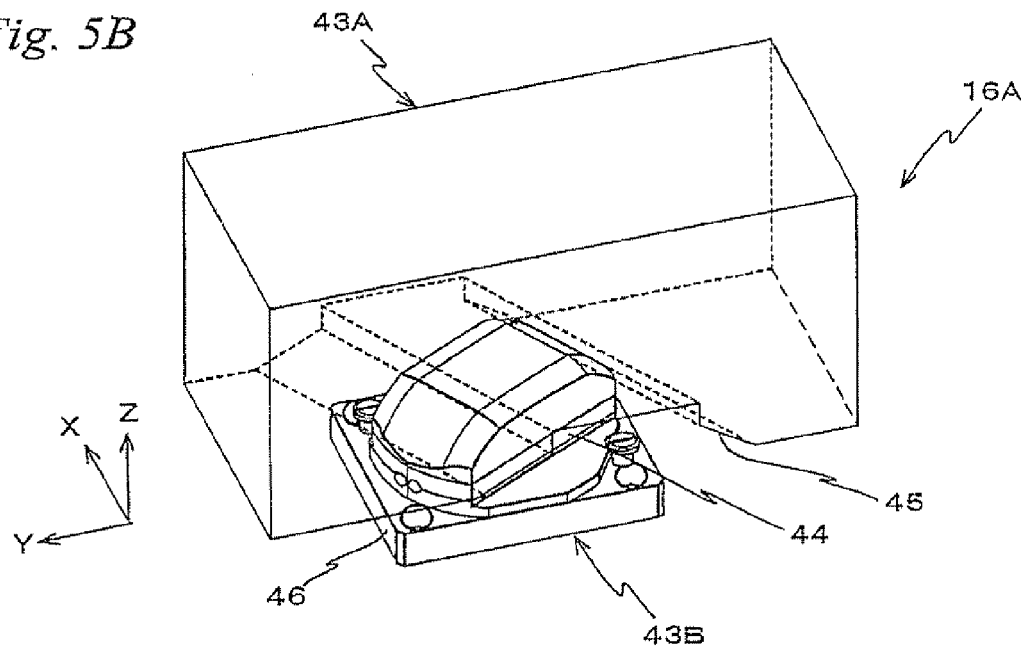

With positioning device 16A, as shown in FIG. 5B, second member 43B is pressed against first member 43A from the lower side, and thereby line contact between protruding section 44 of second member 43B and V groove 45 of first member 43A is made at two positions. Incidentally, protruding section 44 can be a semispherical protruding section. In this case, point contact between protruding section 44 and V groove 45 of first member 43A is made at two positions.

Positioning device 16B has a configuration similar to positioning device 16A, and as shown in FIG. 2, is equipped with a first member 143A provided in a state where a −Y side half is inserted in a recessed section (not illustrated) with a predetermined depth having a rectangular shape elongated in the X-axis direction, when viewed from the +Y side, which is formed on the +Y side surface of wan member 39A, and a second member 143B fixed to the −Y side end of the upper surface of flat plate MP. First member 143A has a V groove 145 formed along a direction intersecting the X-axis and the Y-axis within the XY plane. First member 143A has a bilaterally symmetric configuration to first member 43A described above with respect to a center axis parallel to the Y-axis that passes through the center of stage base 71. While second member 143B is configured similarly to second member 43B described above, protruding section 44 is fixed to foundation section 46 in a state where the orientation of protruding section 44 is directed in a direction corresponding to V groove 145.

With positioning device 16B, similarly to positioning device 16A, second member 143B is pressed against first member 143A from the lower side, and thereby line contact between protruding section 44 of second member 143B and V groove 145 of first member 143A is made at two positions.

As shown in FIG. 2, positioning device 16c is also equipped with a first member 243A provided in a state where a +Y side half is inserted in a recessed section (not illustrated) with a predetermined depth having a rectangular shape elongated in the X-axis direction, when viewed from the −Y side, which is formed on the −Y side surface of wall member 39B that configures a part of frame caster FC, and a second member 243B fixed to the +Y side end of the upper surface of flat plate MP. First member 243A has a V groove 245 formed along the X-axis. While second member 243B is configured similarly to second member 43B described above, protruding section 44 is fixed to foundation section 46 in a state where the orientation of protruding section 44 is directed in a direction corresponding to V groove 245.

Also in positioning device 16C, second member 243B is pressed against first member 243A from the lower side, and thereby line contact between protruding section 44 of second member 243B and V groove 245 of first member 243A is made at two positions.

In three positioning devices 16A to 16C configured as described above, when levitation/elevating devices 18 are in the first state shown in FIG. 4A, against each first member (43A, 143A, 243A), each corresponding second member (43B, 143B, 243B) is pressed from the lower side. Accordingly, flat plate MP (and stage base 71) can be positioned at a desired position with respect to frame caster FC (and metrology frame MF) in the directions of six degrees of freedom, which are the X-axis, the Y-axis, the Z-axis, the θx, the θy and the θz directions (i.e. flat plate MP (and stage base 71) can be positioned at the position such that line contact at two positions between the V grooves of the first members and the protruding sections of the second members of all positioning devices 16A to 16C are made, respectively). Consequently, as is described above, during the operation of the exposure apparatus, since levitation/elevating devices 18 are maintained in the first state, it is possible to maintain a state where stage base 71 is constantly positioned with respect to metrology frame MF and frame caster FC, or in other words, maintain a state where stage module 30 is constantly positioned with respect to metrology frame MF and frame caster FC.

Note that in the second state and the third state, the first members (43A, 143A, 243A) and the corresponding second members (43B, 143B, 243B) do not come in contact with each other (see FIGS. 4B and 4C).

Referring back to FIG. 1, the +Z side surface (upper surface) of stage base 71 that configures a part of stage module 30 is processed so as to have a very high flatness degree, and serves as a guide surface of wafer stage WST and measurement stage MST.

As shown in FIG. 1, wafer stage WST includes a wafer stage main body 91 and a wafer table WTB. Wafer stage main body 91 is made up of a box-shaped (rectangular parallelepiped) member with a rectangular shape in a planar view. Note that, although not illustrated in FIG. 1, wafer stage main body 91 has static gas bearings (e.g. air bearings) at a plurality of positions on its lower surface, and is supported by levitation via an interspace (clearance/gap) of around a several μm with respect to the upper surface of stage base 71, by the static pressure of the pressurized gas jetted from the static gas bearings to the upper surface of stage base 71.

In wafer stage main body 91, an opening section (the illustration is omitted) that penetrates in the X-axis direction is formed, and in the opening section, a stator 80 extending in the X-axis direction is inserted. Stator 80 has a coil unit (the illustration is omitted) including a plurality of coils disposed at a predetermined distance in the X-axis direction and the Z-axis direction. Meanwhile, wafer stage main body 91 has an X-axis mover and a Z-axis mover (the illustration is omitted) that include a plurality of permanent magnets disposed at a predetermined distance in the X-axis direction and the Z-axis direction, respectively. Wafer stage main body 91 is driven with predetermined strokes in the X-axis direction along stator 80, by a moving magnet type X-axis linear motor by the electromagnetic force (Lorentz force) drive method composed of stator 80 and the X-axis mover.

A plurality of the X-axis movers are provided spaced apart in the Y-axis direction, and the plurality of the X-axis movers and stator 80 configure a plurality of X-axis linear motors. Wafer stage main body 91 is finely driven in the θz direction as needed by the plurality of X-axis linear motors. Further, a plurality (at least three) of the Z-axis movers are provided, and the plurality of the Z-axis movers and stator 80 configure a plurality of moving-magnet type Z-axis linear motors by the electromagnetic force (Lorentz force) drive method. Wafer stage main body 91 is finely driven in the θx direction and/or the θy direction (and the Z-axis direction) as needed by the plurality of Z-axis linear motors.

As shown in FIG. 1, stator 80 has a static gas bearing 88 (e.g. air bearing) on the lower surface in the vicinity of each of one end and the other end of its longitudinal direction. Stator 80 is supported by levitation via an interspace (clearance/gap) of around a several μm with respect to the upper surface of stage base 71, by the static pressure of the pressurized gas jetted from static gas bearings 88 to the upper surface of stage base 71.

At one end and the other end of stator 80 in the longitudinal direction, as shown in FIG. 2, a pair of Y-axis movers 82 and 83 are respectively fixed. The pair of Y-axis movers 82 and 83 are in a state engaged with a Y-axis stator 86 that configures a part of countermass module 32A arranged on the +X side of stage module 30 and a Y-axis stator 87 that configures a part of countermass module 32B arranged on the −X side of stage module 30, respectively. Y-axis stators 86 and 87 each have a plurality of coils inside, and each of Y-axis movers 82 and 83 has a plurality of permanent magnets. In other words, Y-axis stator 86 and Y-axis mover 82 configure a moving magnet type Y-axis linear motor that drives Y-axis mover 82 in the Y-axis direction, and Y-axis stator 87 and Y-axis mover 83 configure a moving magnet type Y-axis linear motor that drives Y-axis mover 83 in the Y-axis direction. In the description below, the two Y-axis linear motors are respectively referred to as a Y-axis linear motor 82 and a Y-axis linear motor 83 as needed, using the same reference signs as the respective movers (Y-axis movers 82 and 83).

Since two Y-axis linear motors 82 and 83 are configured as described above, wafer stage WST is driven integrally with stator 80 in the Y-axis direction by these Y-axis linear motors 82 and 83. Consequently, in the embodiment, wafer stage WST is driven in the Y-axis direction by Y-axis linear motors 82 and 83 and also driven in the θz direction by Y-axis linear motors 82 and 83 generating drive forces different from each other.

As shown in FIG. 2, wafer table WTB is made up of a plate-shaped member with a square shape in a planar view and is mounted on wafer stage main body 91. Mirror finishing is applied to the end surfaces on the −X side and the −Y side of wafer table WTB, and reflection surfaces 17*b* and 17*a* are respectively formed. The position of wafer stage WST in the directions of five degrees of freedom except for the Z-axis is constantly detected at a resolution of, for example, around 0.25 nm with a wafer interferometer system including an X interferometer and a Y interferometer that respectively irradiate reflection surfaces 17*b* and 17*a* with measurement beams. Because reflection surfaces 17*b* and 17*a* serve as movable mirrors on which the measurement beams from the X interferometer and the Y interferometer are respectively irradiated, reflection surfaces 17*b* and 17*a* are referred to as an X movable mirror 17*b* and a Y movable mirror 17*a* respectively, as needed in the description below. Incidentally, it is also possible that the position of wafer table WTB is measured with an encoder system, instead of the interferometer system.

As shown in FIG. 1, on the upper surface of wafer table WTB, a wafer holder WH is attached that holds wafer W by vacuum adsorption (or electrostatic adsorption).

As shown in FIG. 2, measurement stage MST is placed on the +Y side of wafer stage WST, and has a measurement stage main body 92 and a measurement table MTB. Measurement stage main body 92 is made up of a box-shaped (rectangular parallelepiped) member with a rectangular shape in a planar view. Note that, although not illustrated in FIG. 1, measurement stage main body 92 has static gas bearings (e.g. air bearings) on its bottom portion. Measurement stage MST is supported by levitation via an interspace (clearance/gap) of around a several μm above stage base 71, by the static pressure of the pressurized gas jetted from the static gas bearings to the upper surface of stage base 71.

In measurement stage main body 92, an opening section (the illustration is omitted) that penetrates in the X-axis direction is formed, and in the opening section, a stator 81 extending in the X-axis direction that includes, for example, a coil unit is inserted. Meanwhile, measurement stage main body 92 has an X-axis mover composed of a magnet unit (the illustration is omitted) including a plurality of permanent magnets disposed at a predetermined distance in the X-axis direction. Measurement stage main body 92 is driven with predetermined strokes in the X-axis direction along stator 81 by a moving magnet type X-axis linear motor by the electromagnetic force (Lorentz force) drive method composed of stator 81 and the X-axis mover. In the description below, this X-axis linear motor is referred to as an X-axis linear motor 81 as needed, using the same reference sign as stator 81.

At one end and the other end of stator 81 in its longitudinal direction, as shown in FIG. 2, a pair of Y-axis movers 84 and 85 are respectively fixed. The pair of Y-axis movers 84 and 85 are in a state engaged with Y-axis stator 86 and Y-axis stator 87, respectively. Each of Y-axis mover 84 and Y-axis mover 85 has a plurality of permanent magnets. In other words, Y-axis stator 86 and Y-axis mover 84 configure a moving magnet type Y-axis linear motor that drives Y-axis mover 84 in the Y-axis direction, and Y-axis stator 87 and Y-axis mover 85 configure a moving magnet type Y-axis linear motor that drives Y-axis mover 85 in the Y-axis direction. In the description below, the two Y-axis linear motors are respectively referred to as a Y-axis linear motor 84 and a Y-axis linear motor 85 as needed, using the same reference signs as the respective Y-axis movers 84 and 85. Incidentally, it is also possible to use a moving coil type liner motor as each of the linear motors described so far, instead of the moving magnet type linear motor.

Since two Y-axis linear motors 84 and 85 are configured as described above, measurement stage MST is driven integrally with X-axis stator 81 in the Y-axis direction by these Y-axis linear motors 84 and 85. Consequently, in the embodiment, measurement stage MST is driven in the X-axis and the Y-axis directions by Y-axis linear motors 84 and 85 and X-axis linear motor 81 and also driven in the θz direction by Y-axis linear motors 84 and 85 generating drive forces different from each other.

Further, static gas bearings used to levitate stator 81 above stage base 71 are attached to the lower surfaces in the vicinity of one end and the other end in the longitudinal direction of stator 81, although these static gas bearings are not illustrated in FIG. 1 because they are hidden behind static gas bearings 88 in the depth of the page surface.

As shown in FIG. 2, measurement table MTB is made up of a plate-shaped member with a rectangular shape in a planar view and is mounted on measurement stage main body 92. Mirror finishing is applied to the end surfaces on the −X side and the +Y side of measurement table MTB, and reflection surfaces 19b and 19a are respectively formed.

At least the position of measurement stage MST (measurement table MTB) within the XY plane (the position in the X-axis, the Y-axis and the θz directions) is constantly detected at a resolution of, for example, around 0.25 nm with an interferometer system including an X interferometer and a Y interferometer that respectively irradiate reflection surfaces 19b and 19a with measurement beams. Because reflection surfaces 19b and 19a serve as movable mirrors on which the measurement beams are respectively irradiated from the X interferometer and the Y interferometer, reflection surfaces 19b and 19a are referred to as an X movable mirror 19b and a Y movable mirror 19a respectively, as needed in the description below.

At measurement table MTB, various types of measurement members are arranged. The measurement members include a fiducial mark area in which a plurality of fiducial marks are formed, which is disclosed in, for example, U.S. Pat. No. 5,243,195 and the like, and sensors (such as an illuminance monitor, an uneven illuminance sensor and an aerial image measuring instrument) that receive illumination light IL via projection optical system PL, and the like.

Referring back to FIG. 1, one of the countermass modules, countermass module 32A is equipped with Y-axis stator 86 described earlier, a countermass 75 fixed to the bottom surface of Y-axis stator 86, a base 73 that supports countermass 75 freely slidable in the Y-axis direction, and a levitation/elevating device 58 that supports base 73 on floor surface F. Further, the other of the countermass modules, counter mass module 32B is equipped with y-axis stator 87 described earlier, a countermass 76 fixed to the bottom surface of Y-axis stator 87, a base 74 that supports countermass 76 by levitation, and levitation/elevating device 5B that supports base 74 on floor surface F.

Countermasses 75 and 76 are each a heavy load with a roughly rectangular parallelepiped shape, and on each of their lower surfaces, a protruding section having a V-shaped XZ cross section and extending in the Y-axis direction is formed. On each of a pair of slope faces of the protruding section, a static gas bearing (e.g. air bearing) that is not illustrated is arranged.

Bases 73 and 74 each have, for example, a roughly rectangular parallelepiped shape, and on each of their upper surfaces, a V groove having a V-shaped XZ cross section and extending in the Y-axis direction is formed. Between a pair of slope faces of the V groove, the protruding section of each of countermasses 75 and 86 is inserted. Countermasses 75 and 76 are supported in a noncontact manner via a predetermined interspace (clearance/gap) above bases 73 and 74, by the static pressure of a gas jetted from the static gas bearings. Consequently, in the case where the reaction force generated by movement of wafer stage WST or measurement stage MST in the Y-axis direction acts on Y-axis stators 86 and 87, Y-axis stator 86 moves integrally with countermass 75 and Y-axis stator 87 moves integrally with countermass 76, along the Y-axis direction. In this case, since Y-axis stator 86 and countermass 75, and Y-axis stator 87 and counter mass 76 move according to the law of conservation of momentum (law of action and reaction), the reaction force described above is canceled by their movement.

Levitation/elevating device 58 has a configuration and functions similar to those of levitation/elevating device 18 described earlier that stage module 30 has, except that their sizes are different. Two levitation/elevating devices 58 are attached, at a predetermined distance in the Y-axis direction, to the lower surface of base 73 (in FIG. 1, one of levitation/elevating devices 58 is hidden behind the other in the depth of the page surface). Consequently, countermass module 32A is capable of adjusting the Z-position of Y-axis stator 86 using an air mount, not illustrated, which levitation/elevating device 58 has, and being levitated above the floor surface using an air hover that is not illustrated. As shown in FIG. 1, countermass module 32B is similarly configured to countermass module 32A except that countermass module 32B is bilaterally symmetric to countermass module 32A when exposure apparatus 100 is viewed from the −Y side, and therefore the description thereof is omitted.

In this case, because countermass modules 32A and 32B are not mechanically connected to stage module 30, the countermass modules can be separated from stage module 30. Consequently, maintenance can be performed dismounting each of countermass modules 32A and 323 from exposure apparatus 100. Then, especially in a state where the countermass modules are levitated above the floor surface using the air hovers that are not illustrated, the countermass modules can easily be separated, and therefore, the maintenance work of countermass modules 32A and 323 can be performed without difficulty.

Exposure apparatus 100 configured as described above is assembled in a semiconductor plant (generally, in a clean room) of a user of exposure apparatus 100. Further, prior to the assembly, manufacturing (including assembly) of exposure apparatus 100 of the embodiment is performed in a plant of the exposure apparatus manufacturer.

Next, a manufacturing method of exposure apparatus 100 is described with reference to FIGS. 6A and 6B. After an illumination module, reticle stage module 12, a projection lens module, stage module 30, countermass modules 32A and 32B and body BD are individually assembled and adjusted in the manufacturing plant of exposure apparatus 100, shipment in a unit of module is made to a predetermined destination of shipment (such as a manufacturing plant of semiconductors), and a plurality of the modules are docked together in the destination of shipment, and thereby exposure apparatus 100 is manufactured. In this case, the illumination module is a module of illumination system 10 shown in FIG. 1 including the light source, the illumination optical system and the like, and the projection lens module is a module of projection unit PU shown in FIG. 1 including barrel 40 and projection optical system PL. Incidentally, it is also possible that the illumination module does not include the light source but includes only the illumination optical system, or includes the illumination optical system and another unit (e.g. a beam matching unit or the like).

Figure 6A:
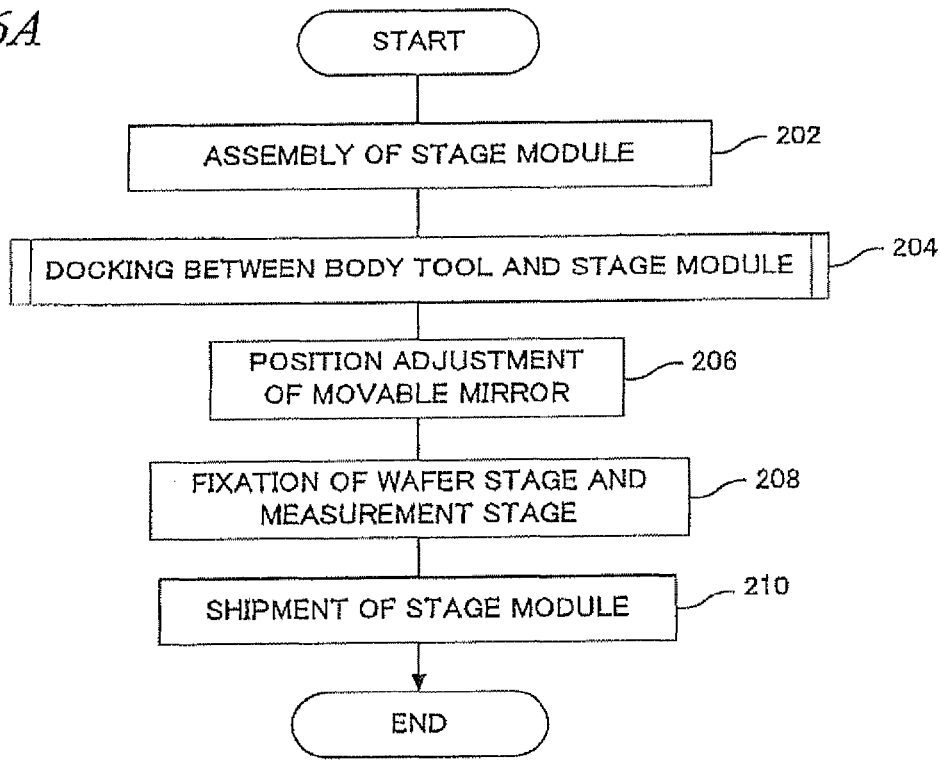
FIGS. 6A and 6B are flowcharts (No. 1 and No. 2) used to explain a manufacturing method of the exposure apparatus.

In assembly of stage module 30, as shown in FIG. 6A, first in step 202, assembly of stage module 30, or in other words, respective components that configure stage module 30 shown in FIGS. 1 and 2 are assembled with one another. To be specific, four levitation/elevating devices 18 are installed on floor surface F (in a clean room) inside the manufacturing plant of exposure apparatus 100 of the exposure apparatus manufacturer, and flat plate MP is mounted on four levitation/elevating devices 18, and further stage base 71 is mounted on flat plate MP. And, on stage base 71, wafer stage WST and measurement stage MST are mounted, and stators 80 and 81 are respectively inserted in wafer stage WST and measurement stage MST, and then movers 82 and 83 and movers 84 and 85 are connected to stators 80 and 81, respectively.

Next, in step 204, stage module 30 is docked with, for example, a device that is referred to as a body tool, not illustrated, installed in the manufacturing plant. The body tool is substantially the same as body BD shown in FIG. 1. Consequently, the body tool has a metrology frame tool (the illustration is omitted) that is substantially the same member as metrology frame MF shown in FIG. 1. Members such as the interferometers, the alignment system, the other measurement systems and the like to be attached to metrology frame MF are accurately adjusted such that the states of such members (such as the attached positions of the measurement systems, and the positions of optical axes of the interferometers) are the same between the metrology frame tool and metrology frame MF of the actual apparatus, i.e. the apparatus that is to be shipped from the exposure apparatus manufacturer and delivered to a device manufacturing plant of a user of the espouser apparatus (in practice, as is described later, the state of body BD of the actual apparatus is adjusted into the same state as the body tool, and then body BD is shipped). Herein, in the case of using an interferometer in which a reference mirror (fixed mirror) is placed outside an interferometer main body, it is also possible that the reference mirror is attached in a predetermined positional relation with the metrology frame tool (and metrology frame MF). However, the exposure processing is not performed on wafer W using the body tool, and therefore, for example, it is also possible that instead of the alignment system, the other measurement systems and the like, a dummy tool that has the same weight as the alignment system, the other measurement systems and the like is attached to the body tool. Further, a tool for adjustment of the stage module or the like may be arranged at the body tool.

Figure 7:
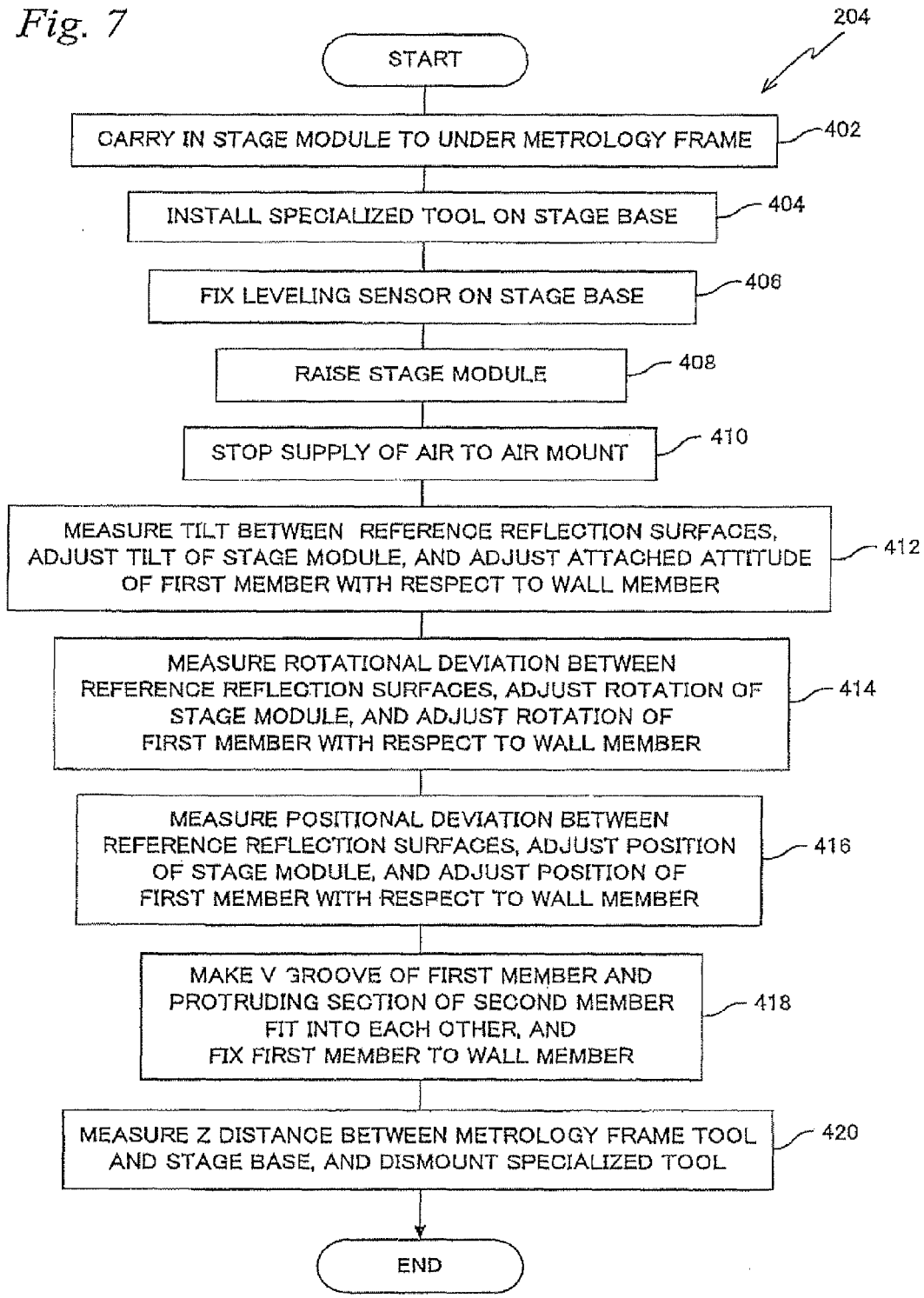
FIG. 7 is a flowchart used to explain an example of the specific procedure of step 204.

The docking between the body tool and stage module 30 in step 204 is performed by a worker in the procedure shown in steps 402 to 420 in FIG. 7, as an example. Prior to start of step 402, attachment and position adjustment of each of the X interferometers and the Y interferometers attached to the metrology frame tool, which the body tool described above has, have been already performed in a manner to be described later. Therefore, a tool (hereinafter, referred to as a reference mirror tool) having a reference reflection surface used for position adjustment of each of the X interferometers and the Y interferometers is attached to the metrology frame tool in a state where a degree of orthogonality, a degree of perpendicularity and the like of the reflection surface are accurately adjusted. And, the reference reflection surface of the reference mirror tool is precisely parallel to absolute reference surfaces (e.g. the +X side end surface and the −X side end surface) arranged at the metrology frame tool and is parallel to a vertical axis.

First of all, in step 402 in FIG. 7, the worker supplies air to air hovers 29 of levitation/elevating devices 18 and carries stage module 30 into a space under the metrology frame tool that the body tool is equipped with, in a state where stage module 30 is levitated above floor surface F by air hovers 29.

Next, in step 404, the worker installs a specialized tool having a reference reflection surface similar to that of the reference mirror tool, onto stage base 71. At this point, the specialized tool is installed in a state where its reference reflection surface is precisely parallel to stage position reference surfaces (e.g. the +X side end surface and the −X side end surface) that stage base 71 has.

Next, in step 406, the worker fixes a leveling sensor, e.g. an air bubble sensor, used to measure the degree of orthogonality of the upper surface of stage base 71 with respect to the vertical axis, i.e. a tilt with respect to a horizontal plane, on stage base 71.

Next, in step 408, the worker raises stage module 30 by supplying air to air mounts 26 of levitation/elevating devices 18. At this point, the worker adjusts the supply of the air to air mounts 26 of four levitation/elevating devices 18 such that stage base 71 moves upward while substantially keeping a horizontal state.

Then, when stage module 30 moves upward to a predetermined height, in step 410, the worker stops the supply of the air to air mounts 26 of levitation/elevating devices 18. At this point, stage module 30 is stopped in a state where V grooves 45, 145 and 245 of first members 43A, 143A and 243A and protruding sections 44 of second members 43B, 143B and 243B substantially fit into each other, respectively, which positioning devices 16A to 160 respectively have. At this point, while second members 43B, 143B and 243B are fixed at the positions shown in FIG. 2 on flat plate MP, in the state shown in FIG. 2, first members 43A, 143A and 243A are all in a state where their positions in the directions of six degrees of freedom are finely adjustable.

Next, in step 412, the worker measures the tilt (rotational deviation in the θx and the θy directions) of the reference reflection surface of the specialized tool with respect, to the reference reflection surface of the reference mirror tool, and based on the measurement results, adjusts the tilt (rotation in the θx and the θy directions) of stage module 30 and also adjusts the attached attitude of first members 43A, 143A and 243A with respect to wall members 39A and 39B. The worker measures the parallelism between the reference reflection surface of the reference mirror tool and the reference reflection surface of the specialized tool using, for example, a plurality of autocollimators or an autocollimator that is capable of performing multiaxial measurement, adjusts the tilt of stage module 30 via air mounts 26 of levitation/elevating devices 18, and for example, performs adjustment of shims, thereby adjusting the attached attitude (rotation in the θx and the θy directions) of first members 43A, 143A and 243A with respect to wall members 39A and 395.

Next, in step 414, the worker measures a rotational deviation in the θz direction within the XY plane of the reference reflection surface of the specialized tool with respect to the reference reflection surface of the reference mirror tool and also adjusts the rotation in the θz direction of stage module 30 based on the measurement results, thereby adjusting the rotation in the θz direction of first members 43A, 143A and 243A with respect to wall members 39A and 39B. In this step 414, the measurement is performed using the autocollimator(s), the rotation of stage module 30 in the θz direction is adjusted based on the measurement results, and for example, shims is adjusted, and thereby the attached attitude of first members 43A, 143A and 243A with respect to wall members 39A and 39B in the θz direction is adjusted.

Next, in step 416, the worker measures a positional deviation in the XY orthogonal two axes directions of the reference reflection surface of the specialized tool with respect to the reference reflection surface of the reference mirror tool, and based on the measurement results, adjusts the X and the Y positions of stage module 30, and at the same time, adjusts the X and the I positions of first members 43A, 143A and 243A with respect to wall members 39A and 39B. For example, using an interferometer, the positional deviation in the XY orthogonal two axes directions of the reference reflection surface of the specialized tool with respect to the reference reflection surface of the reference mirror tool can be measured. Or, it is also possible that one of the reference reflection surfaces is copied on the same plane as the other of the reference reflection surfaces using an appropriate jig, and the positional deviation in the XY orthogonal two axes directions of the reference reflection surface of the specialized tool with respect to the reference reflection surface of the reference mirror tool is measured by a digital micrometer or the like.

Next, in step 418, the worker reliably makes V grooves 45, 145 and 245 of first members 43A, 143A and 243A and protruding sections 44 of second members 43B, 143B and 243B fit into each other, respectively, by raising stage module 30 by a small distance. Then, after confirming that the reference reflection surface of the reference mirror tool and the reference reflection surface of the specialized tool are parallel, the worker fixes first members 43A, 143A and 243A to wall members 39A and 39B.

Finally, in step 420, after a distance in the Z-axis direction between the metrology frame tool and stage base 71 is measured at three or four positions, the specialized tool is dismounted from stage base 71. Accordingly, the docking between the body tool and stage module 30 is completed.

After the docking with the body tool has been completed, adjustment of each of the movable mirrors of the wafer interferometer system is performed in step 206. More specifically, stage module 30 is lifted to the +Z side by levitation/elevating devices 18, and wafer stage WST is lifted to the +Z side by the static gas bearings arranged on the lower surface of wafer stage main body 91 up to the position where the measurement beams irradiated from the Y interferometer and the X interferometer are incident on Y movable mirror 17a and X movable mirror 17b, respectively. After that, while wafer stage main body 91 is moved in the X-axis and the Y-axis directions as needed, the position (in the θx, the θy and the θz directions) of each of the movable mirrors, i.e. the rotation (position in the θz direction) and the tilt (position in the θx and the θy directions) of wafer stage WST are adjusted such that the measurement beam irradiated from each of the interferometers is incident perpendicularly on the corresponding movable mirror.

After the position adjustment work of the movable mirrors in step 206 has been completed, in wafer stage WST, the supply of the pressurized gas to the static gas bearings that wafer stage main body 91 has is stopped in step 208. Accordingly, wafer stage WST descends and comes in contact with the upper surface of stage base 71. Wafer stage WST is fixed to stage base 71 (or flat plate MP) in a state contact with the upper surface of stage base 71 using a tool that is not illustrated. Similarly, measurement stage MST is also fixed in a state contact with the upper surface of stage base 71 using a tool that is not illustrated, after the position adjustment of Y movable mirror 19a and X movable mirror 19b with respect to the measurement axes of the interferometers has been performed in step 206.

Next, in step 210, stage module 30 in which wafer stage WST and measurement stage MST are fixed is shipped from the manufacturing plant to a destination of shipment.

At the destination of shipment, stage module 30 and body BD that has already been assembled at the destination of shipment are docked with each other. At this point, adjustment of the positions and the attitudes of first members 43A, 143A and 243A, which body BD has, with respect to wall members 39A and 39B in the directions of six degrees of freedom has been performed in advance before the shipment, in the procedure similar to the above-described one, and therefore, only by making V grooves 45, 145 and 245 of first members 43A, 143A and 243A and protruding sections 44 of second members 43B, 143B and 243B reliably fit into each other, respectively, in the procedure similar to that in steps 402, (406,) 408, 410 and 418, the absolute reference surfaces of metrology frame MF that body BD has and the stage position reference surfaces that stage base 71 of stage module 30 has come into the same positional relation as the positional relation at the time of the adjustment (refer to step 204) in the manufacturing plant. In other words, when the docking between stage module 30 and body BD that has been already assembled at the destination of shipment is performed, the measurement and accompanying processing (in the steps such as steps 404, 412, 414 and 416) for position adjustment of both become unnecessary. Consequently, the assembly (start-up) of the exposure apparatus at the destination of shipment becomes simple and can be performed in a short time. It should be confirmed that the Z distance is the same as the Z distance measured beforehand in step 420.

Further, the illumination module, reticle stage module 12, the projection lens module and the like are docked with body BD. Further, countermass modules 32A and 32B are docked with stage module 30.

In this case, all the components of body ED can be adjusted with the absolute reference surfaces of metrology frame MF serving as a reference, and all the components of stage module 30 can be adjusted with the stage position reference surfaces serving as a reference. Consequently, all the components of body BD and all the components of the stage module can be adjusted after the docking, but in the embodiment, as is described above, the metrology frame tool that the body tool has and metrology frame MF that body BD installed at the destination of shipment has are accurately adjusted so as to be the same as each other in the states (such as the attached positions and the optical axes) of the X interferometers and Y interferometers. Consequently, when stage module 30 in which the position adjustment of each of the movable mirrors of the wafer interferometer system has been performed using the metrology frame tool is docked with body BD, automatically the measurement beams irradiated from the X interferometers and the Y interferometers fixed to metrology frame MF come to be incident perpendicularly on X movable mirrors 17b and 19b and Y movable mirrors 17a and 19a. Accordingly, the position adjustment work of each of the interferometers of the wafer interferometer system and of the movable mirrors with respect to the respective interferometers to be performed after stage module 30 has been docked with body BD can be omitted, which makes it possible to reduce the assembly work time of exposure apparatus 100 at the destination of shipment. Further, for example, in the case of exchanging stage module 30, assembly of a new stage module 30 and position adjustment of the movable mirrors (the processing in steps 202 to 208 described above) are performed in the manufacturing plant, using the body tool in which the first members of the positioning devices are positioned at predetermined positions, and thereby the docking of the new stage module 30 with body BD at the destination of shipment can be performed without difficulty and also the position adjustment work of the movable mirrors after the docking can be omitted.

In the embodiment, stage module 30 is shipped in which the adjustment of the positioning devices at the time of the docking with respect to the body tool (i.e. a body serving as a reference) and the position adjustment of each of the movable mirrors of the wafer interferometer system with respect to the metrology frame tool have been performed in the manufacturing plant. Further, stage module 30 has been adjusted such that the single body accuracy (such as vibration, positioning, frequency responsive property and air pressure) falls within constant standards, in the manufacturing plant.

Incidentally, in the work at the manufacturing plant, the assembly of stage module 30 and the position adjustment of the movable mirrors (the processing in steps 202 to 208 described above) can be performed using body BD (metrology frame MF) that is to be used in practice at the destination of shipment, instead of the body tool.

Next, described is the attachment/adjustment procedure, in the manufacturing plant of the exposure apparatus, of the X interferometers, the Y interferometers and the like that metrology frame MF of body BD has, with body BD the docking of stage module 30 being preformed at the destination of shipment.

Adjustment of the attached positions of the X interferometers, the y interferometers and the like with respect to metrology frame MF is performed using a member that is referred to as a stage module tool, in the manufacturing plant of the exposure apparatus. The stage module tool is substantially the same as stage module 30 shown in FIG. 1, and the positions of the movable mirrors have been accurately adjusted in the procedure similar to that in steps 202 to 206 (see FIG. 6A).

Figure 6B:
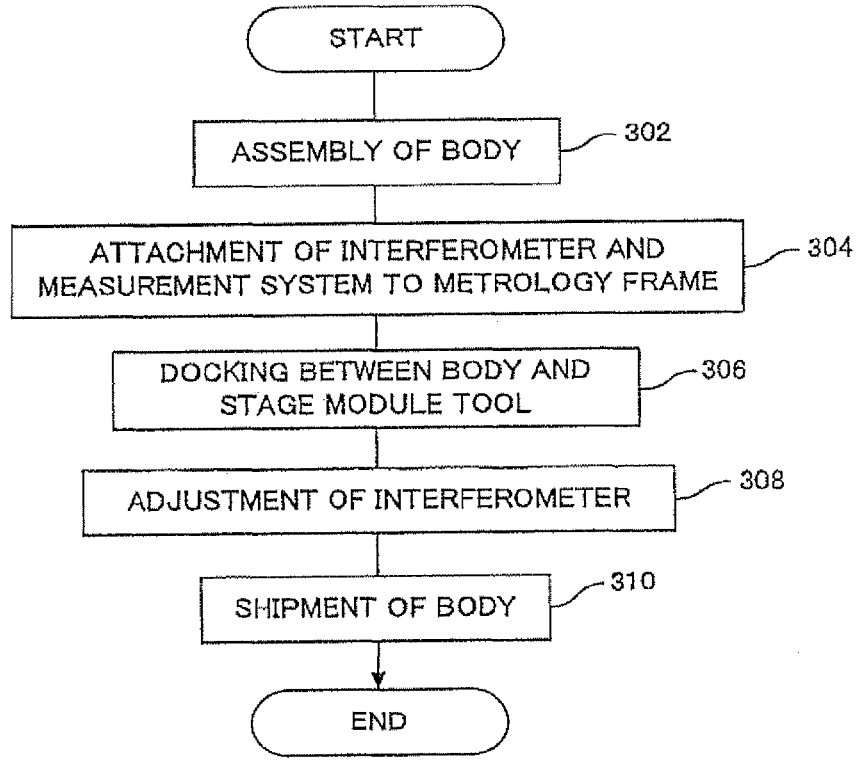

In the manufacturing of body BD, as shown in FIG. 6B, first in step 302, assembly of body BD, or more specifically, assembly of frame caster FC (wall members 39A and 39B), first frame 232, metrology frame MF and the like is performed. After that, in step 304, the Y interferometers, the X interferometers, the measurement system and the like are attached to metrology frame MF that body BD has. Subsequently, in step 306, docking of the stage module tool with body BD is performed. This docking is performed basically in a similar manner to step 204. Consequently, at the point when this docking has been completed, the first members of the positioning devices are adjusted into a desired positional relation with respect to the stage module tool and stage module 30 described above (stage module 30 with which body BD is docked at the destination of shipment).

After the stage module tool is docked with body BD, optical axis adjustment and the like of the interferometers attached to metrology frame MF are performed in step 308, using X movable mirrors 17b and 19b and Y movable mirrors 17a and 19a and the like that the stage module tool has. To be specific, the respective attached positions and optical axes of the X interferometer and the Y interferometer are adjusted such that the measurement beams are incident perpendicularly on X movable mirrors 17b and 19b and Y movable mirrors 17a and 19a.

After that, in step 310, the stage module tool is dismounted from body BD, and body BD is shipped to the destination of shipment. With body BD installed at the destination of shipment, stage module 30, which has been adjusted in advance using the body tool in the procedure in steps 202 to 210 (see FIG. 6A) described above and shipped, is docked.

Note that, in general, after body BD has been shipped from the manufacturing plant, stage module 30 is shipped from the manufacturing plant. Consequently, when stage module 30 is docked with body BD, the absolute reference surfaces of metrology frame MF that body BD has and the stage position reference surfaces that stage base 71 of stage module 30 has come into the same positional relation as the positional relation at the time of the adjustment in the manufacturing plant (refer to step 204). Further, automatically the measurement beams irradiated from the X interferometers and the Y interferometers fixed to metrology frame MF come to be incident perpendicularly on X movable mirrors 17b and 19b and Y movable mirrors 17a and 19a, and therefore, the adjustment work of the attached positions and the optical axes of the interferometers to be performed after stage module 30 has been docked with body BD can be omitted. Accordingly, the assembly work time of exposure apparatus 100 at the destination of shipment can be reduced. Incidentally, it is also possible that in the work in the manufacturing plant, the adjustment of the interferometers and the like is performed using stage module 30 that is to be used in practice at the destination of shipment, without using the stage module tool.

As is described above, in the manufacturing method of exposure apparatus 100 of the embodiment, the body tool is firstly manufactured, and then the stage module tool is manufactured using the body tool. In other words, the body tool is docked with the stage module tool, and the position adjustment of first members 43A, 143A and 243A of respective positioning devices 16A, 16B and 16C that the body tool and the stage module tool are equipped with is performed similarly to step 204 described above such that the absolute reference surfaces of the metrology frame tool and the stage position reference surfaces of the stage module tool are in a constant positional relation.

Then, stage module 30 of the actual apparatus is produced in large numbers using the body tool after the adjustment, and body BD of the actual apparatus is produced in large numbers using the stage module tool. In this case, when the body tool is docked with stage module 30 that is produced in large numbers, the position adjustment of first members 43A, 143A and 243A of respective positioning devices 16A, 16B and 16C has been performed in advance such that the positional relation between the absolute reference surfaces of the metrology frame tool of the body tool and the stage position reference surfaces that stage base 71 of stage module 30 has are maintained constant at all times. Further, in stage module 30, adjustment of the movable mirrors using the body tool and adjustment to make the singe body accuracy (such as vibration, positioning, frequency responsive property and air pressure) fall within constant standards have been performed before the shipment. Consequently, according to the embodiment, it becomes possible to ship (supply) wafer stage module 30 in which the single body accuracy has been adjusted to fall within constant standards. In this respect, the body tool (i.e. the body serving as a reference) can be expressed in another term, such as a reference/adjustment tool, a reference/adjustment frame, or a frame tool.

Further, when the body tool, in which the position adjustment of first members 43A, 143A and 243A of respective positioning devices 16A, 16B and 16C has been performed, is docked with the stage module tool, the absolute reference surfaces of the metrology frame tool and the stage position reference surfaces of the stage module tool are in the same relation as the above-described one. Then, for a plurality of bodies BD that are produced in large numbers, all the adjustment of the interferometers and the like is performed using the stage module tool.

Consequently, one of a plurality of stage modules 30 that are produced in large numbers and one of the plurality of bodies BD that are produced in large numbers are docked with each other, even in any combinations of stage module 30 and body BD, the positional relation between the absolute reference surfaces of metrology frame MF and the stage position reference surfaces that stage base 71 of stage module 30 has come into an ideal state only by making the first members and the second members of positioning devices 16A to 16C fit into each other. Therefore, adjustment of the positional relation between stage module 30 and body BD becomes unnecessary. Further, adjustment of the interferometer system (the interferometers and the movable mirrors) becomes unnecessary.

Consequently, according to the embodiment, the assembly work time of exposure apparatus 100 can be reduced. Further, since the installation of body BD at the destination of shipment and the adjustment of stage module 30 in the manufacturing plant can also be performed in parallel, the assembly work time of exposure apparatus 100 can be reduced in this respect as well.

While, in the embodiment above, the case has been described where not only the position adjustment of the first members of positioning devices 16A to 16C but also the adjustment of the interferometer system (the interferometers and the movable mirrors) are performed prior to the shipment of stage module 30 or body BD, the adjustment of the interferometer system (the interferometers and the movable mirrors) does not necessarily have to be performed prior to the shipment of stage module 30 or body BD. In such a case as well, as far as the positional relation between the positional reference of body BD and the positional reference of stage module 30 has been adjusted into a desired relation, adjustment of the positions of the components of body BD and the components of stage module 30 can be performed in a relatively short time at the destination of shipment, with the positional references serving as references.

Incidentally, while, in the embodiment above, the three positioning devices with the combination of the protruding sections and the V grooves are used as positioning devices 16A to 16C, this is not intended to be limiting, and it is also possible to employ a normal kinematic structure (a structure that comes in contact at points, V grooves and surfaces).

Incidentally, while, in the embodiment above, the case has been described where first members 43A, 143A and 243A that configure positioning devices 16A to 16C are arranged at wall members 39A and 39B and second members 43B, 143B and 2438 are arranged at flat plate MP, this is not intended to be limiting, and it is also possible that the first members are arranged at flat plate MP and the second members are arranged at wall members 39A and 39B. In other words, it is also possible that the second members have a fixed positional relation with wall members 39A and 39B and the positions of the first members with respect to flat plate MP in the directions of six degrees of freedom are adjustable. Further, the first members or the second members can be arranged at stage base 71 instead of flat plate MP, or the second members or the first members can be arranged at metrology frame MF instead of wall members 39A and 39B.

In either case, in the case where the high-volume production and the shipment of stage module 30 are intended, it is desirable that position adjustment of the members of the positioning devices provided on the body BD side (wall members 39A and 39B, metrology frame MF) with respect to body BD can be performed, and similarly, in the case where the high-volume production and the shipment of body BD are intended, it is desirable that position adjustment of the members of the positioning devices provided on the stage module 30 side (flat plate MP, stage base 71) with respect to stage module 30 can be performed. In such cases, the position adjustment of the members of the positioning devices on the tool side can be performed in the manufacturing plant. Consequently, the adjustment of the positioning devices is performed in the similar procedure to the one described above in the manufacturing plant, and thereby at the destination of shipment, with respect to body BD or stage module 30, the docking of shipped stage module 30 or body BD can be performed via the adjusted positioning devices.

Further, on the premise that the members of the positioning devices on the tool side have been appropriately adjusted, if the members on the stage module 30 side are adjusted using the adjusted body tool, then after the shipment, the body in a state similar to the body tool and stage module 30 can be correctly docked with each other. Similarly, also in the case where the high-volume production and the shipment of body BD are intended, it is desirable that the position adjustment is implemented with the stage module tool to keep the body constantly in the same state. More specifically, it is desirable that the body tool and the stage module tool are both prepared in the manufacturing plant of the exposure apparatus, the body and the stage module are adjusted respectively using the stage module tool and the body tool and are shipped, in a unit of module, and are docked with each other on site (the device manufacturing plant of a user). Further, at least one of the body tool and the stage module tool can be the body and/or the stage module to be shipped to the plant of the user. Furthermore, on the shipment, the body and the stage module are shipped, in a unit of module at the time of the adjustment as described above (without being disassembled), but members whose influence on the accuracy is ignorable or whose adjustment on site is substantially unnecessary can be dismounted from the module and transported. Further, a plurality of the modules that can be docked together in the embodiment above can be handled as one module. For example, stage module 30 and countermass modules 32A and 32B can be handled as one wafer stage module. In this case, the countermasses whose influence on the accuracy is ignorable or whose adjustment is substantially unnecessary on site are dismounted and transported.

Further, while, in the embodiment above, the case has been described where levitation/elevating devices 18 each have a configuration in which the air spring device and the hover device are integrated, this is not intended to be limiting, and it is also possible that the air spring device and the hover device are configured as different bodies, and each of them are arranged on the lower surface of flat plate MP.

Further, while the air spring devices and the hover devices are employed in the embodiment above, this is not intended to be limiting, and devices other than the air spring devices can be employed if such devices are capable of adjusting the position of stage module 30 in the height direction, or devices (e.g. static gas bearings, or the like) other than the air hovers can be employed if such devices are capable of levitating stage module 30 above floor surface F (or the base plate).

Incidentally, while, in the embodiment above, positioning devices 16A to 16C are used to position stage module 30 with respect to frame caster FC (wall members 39A and 39B), along with or instead of this arrangement, positioning devices similar to those in the embodiment above can be used in order to position the other modules that configure the exposure apparatus with respect to body BD. For example, it is also possible to use positioning devices similar to those in the embodiment above in order to position reticle stage module 12 with respect to body BD. In this case, such positioning devices can be provided between reticle stage module 12 and reticle base 36, and therefore by pressing the first members and the second members that configure the positioning devices by the self weight of reticle stage module 12, reticle stage module 12 can be positioned with respect to body BD and the positional relation between reticle stage module 12 and body BD can be set in a desired relation. Further, in this case, it is also possible that a body tool having a reticle base tool and a reticle stage module tool are prepared, and manufacturing of the body and the reticle stage in the manufacturing plant in the procedure similar to that in the embodiment above and shipment of the module are performed, and then assembly of the exposure apparatus including the docking between the body and the reticle stage is performed at the destination of shipment. Similarly, it is also possible that positioning devices similar to those in the embodiment above are used to position countermass modules 32A and 32B with respect to the body.

Incidentally, while, in the embodiment above, stage module 30, and countermass modules 32A and 32B are configured as different bodies, this is not intended to be limiting, and the stage module and the countermass modules can be integrally configured.

Incidentally, while, in the embodiment above, the manufacturing of the exposure apparatus in which the stage module has the wafer stage and the measurement stage has been described, this is not intended to be limiting, and as disclosed in, for example, U.S. Pat. Nos. 6,590,634, 5,969,441, 6,208,407 and the like, the manufacturing method of the embodiment above can also be applied to an exposure apparatus having a plurality of wafer stages. Further, the embodiment above can also be applied to a single stage type exposure apparatus having a single wafer stage.

Incidentally, while, in the embodiment above, the manufacturing method of the dry type exposure apparatus that performs exposure of wafer W not via a liquid (water) has been described, this is not intended to be limiting, and as disclosed in, for example, EP Patent Application Publication No. 1 420 298, PCT International Publication No. 2004/055003, U.S. Pat. No. 6,952,253 and the like, the manufacturing method of the embodiment above can also be applied to manufacturing of an exposure apparatus in which a liquid immersion space that includes an optical path of illumination light is formed between a projection optical system and a wafer and the wafer is exposed with the illumination light via the projection optical system and a liquid in the liquid immersion space. Further, the embodiment above can also be applied to manufacturing of a liquid immersion exposure apparatus and the like disclosed in, for example, U.S. Patent Application Publication No. 2008/0088843.

Incidentally, while, in the embodiment above, a configuration is employed in which wafer stage WST and measurement stage MST are driven on the surface plate by the linear motors, this is not intended to be limiting, and it is also possible that the stages are driven by planar motors by the electromagnetic force (Lorentz force) drive method that is disclosed in, for example, U.S. Pat. No. 5,196,745 and the like. Further, while, in the embodiment above, the manufacturing of the scanning stepper has been described, this is not intended to be limiting, and the embodiment above can also be applied to manufacturing of a static type exposure apparatus such as a stepper. Further, the embodiment above can also be applied to a reduced projection exposure apparatus by a step-and-stitch method that synthesizes a shot area and a shot area.

Further, the magnification of the projection optical system in the exposure apparatus of the embodiment above is not only a reduction system, but also can be either an equal magnifying system or a magnifying system, and the projection optical system is not only a dioptric system, but also can be either a catoptric system or a catadioptric system, and in addition, the projected image can be either an inverted image or an erected image.

Further, illumination light IL is not limited to ArF excimer laser light (with a wavelength of 193 nm), but can be ultraviolet light such as KrF excimer laser light (with a wavelength of 248 nm), or vacuum ultraviolet light such as $F_2$ laser light (with a wavelength of 157 nm). As disclosed in, for example, U.S. Pat. No. 7,023,610, a harmonic wave, which is obtained by amplifying a single-wavelength laser beam in the infrared or visible range emitted by a DFB semiconductor laser or fiber laser with a fiber amplifier doped with, for example, erbium (or both erbium and ytterbium), and by converting the wavelength into ultraviolet light using a nonlinear optical crystal, can also be used as vacuum ultraviolet light.

Further, in the embodiment above, illumination light IL of the exposure apparatus is not limited to the light having a wavelength more than or equal to 100 nm, and it is needless to say that the light having a wavelength less than 100 nm can be used. For example, in recent years, an EUV (Extreme Ultraviolet) exposure apparatus that makes an SOR or a plasma laser serving as a light source generate EUV light in a soft X-ray range (e.g. a wavelength range from 5 to 15 nm) and uses a total reflection reduction optical system designed under the exposure wavelength (e.g. 13.5 nm) and a reflective type mask has been developed, in order to expose a pattern less than or equal to 70 nm. In this apparatus, a configuration can be considered in which scanning exposure is performed synchronously scanning a mask and wafer using a circular arc illumination, and therefore, the manufacturing method of the embodiment above can suitably be applied to manufacturing such an apparatus as well. In addition, the embodiment above can also be applied to manufacturing of an exposure apparatus that uses charged particle beams such as an electron beam or an ion beam.

Further, in the embodiment above, a light transmissive type mask (reticle) is used, which is obtained by forming a predetermined light-shielding pattern (or a phase pattern or a light-attenuation pattern) on a light-transmitting substrate, but instead of this reticle, as disclosed in, for example, U.S. Pat. No. 6,778,257, an electron mask (variable shaped mask) on which a light-transmitting pattern, a reflection pattern, or an emission pattern is formed according to electronic data of the pattern that is to be exposed can also be used.

Further, the embodiment above can also be applied to manufacturing of an exposure apparatus (lithography system in which line-and-space patterns are formed on a wafer by forming interference fringes on the wafer, as disclosed in, PCT international Publication No. 2001/035168.

Moreover, the embodiment above can also be applied to an exposure apparatus that synthesizes two reticle patterns on a wafer via a projection optical system and substantially simultaneously performs double exposure of one shot area on the wafer by one scanning exposure, as disclosed in, for example, U.S. Pat. No. 6,611,316.

Incidentally, an object on which a pattern is to be formed (an object subject to exposure on which an energy beam is irradiated) in the embodiment above is not limited to a wafer, but may be another object such as a glass plate, a ceramic substrate, a film member, or a mask blank.

The usage of the exposure apparatus is not limited to the exposure apparatus used for manufacturing semiconductor devices, but the embodiment above can be widely applied also to, for example, an exposure apparatus for manufacturing liquid crystal display elements in which a liquid crystal display element pattern is transferred onto a rectangular glass plate, and to an exposure apparatus for manufacturing organic EL, thin-film magnetic heads, imaging devices (such as CCDs), micromachines, DNA chips or the like. Further, the embodiment above can also be applied to an exposure apparatus that transfers a circuit pattern onto a glass substrate, a silicon wafer or the like not only when producing microdevices such as semiconductor devices, but also when producing a reticle or a mask used in an exposure apparatus such as an optical exposure apparatus, an EUV exposure apparatus, an X-ray exposure apparatus, and an electron beam exposure apparatus.

Semiconductor devices are manufactured through the following steps: a step where the function/performance design of a device is performed; a step where a reticle based on the design step is manufactured; a step where a wafer is manufactured using a silicon material; a lithography step where a pattern formed on the reticle is transferred onto an object such as the wafer; a device assembly step (including a dicing process, a bonding process, and a packaging process); an inspection step; and the like. In this case, in the lithography step, the exposure apparatus of the embodiment above is used, and therefore, the devices with a high integration degree can be manufactured with high productivity.

Incidentally, the disclosures of all publications, the PCT International Publications, the U.S. Patent Application Publications and the U.S. patents that are cited in the description so far related to exposure apparatuses and the like are each incorporated herein by reference.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A manufacturing method of an exposure apparatus to manufacture an exposure apparatus that comprises a plurality of modules including a body and a first module to be docked with the body and exposes a sensitive object, the method comprising:
    adjusting a first positioning device provided between a body tool that is substantially a same member as the body to be shipped and the first module such that a positional relation between the body tool and the first module at the time of docking between them becomes a desired relation;
    shipping the first module whose positional relation at the time of the docking with the body tool via the first positioning device after the adjustment becomes the desired relation; and
    docking the body and the first module with each other via a second positioning device having a same configuration as the first positioning device, at a destination of shipment, the second positioning device being in a same state as the first positioning device after the adjustment and being provided between the body and the first module.

2. The manufacturing method of the exposure apparatus according to claim 1, wherein
    as the body tool, the body to be shipped is used.

3. The manufacturing method of the exposure apparatus according to claim 1, wherein
    in the adjusting the first positioning device, the first positioning device is adjusted such that a positional relation between a first reference surface of the body tool and a second reference surface of the first module becomes a desired relation.

4. The manufacturing method of the exposure apparatus according to claim 3, wherein
    the adjusting the first positioning device includes measuring a tilt between the first reference, surface and the second reference surface and adjusting the first positioning device such that a tilt of the first module is adjusted.

5. The manufacturing method of the exposure apparatus according to claim 3, wherein
    the adjusting the first positioning device includes measuring a rotational deviation between the first reference surface and the second reference surface and adjusting the first positioning device such that a rotation of the first module is adjusted.

6. The manufacturing method of the exposure apparatus according to claim 3, wherein
    the adjusting the first positioning device includes measuring a positional deviation between the first reference surface and the second reference surface and adjusting the first positioning device such that a position of the first module is adjusted.

7. The manufacturing method of the exposure apparatus according to claim 1, wherein
    the adjusting the first positioning device includes engaging a first member that is arranged at one of the body tool and the first module and has a recessed section formed thereon, and a second member that is arranged at the other of the body tool and the first module and has a protruding section, with each other, by engagement between the recessed section and the protruding section, and adjusting a position of one of the first member and the second member that is arranged at the body tool with respect to the body tool, the first member and the second member configuring the first positioning device.

8. The manufacturing method of the exposure apparatus according to claim 7, wherein
    the docking includes engaging one member of the first member arranged at one of the body and the first module and the second member arranged at the other of the body and the first module, and the other member of the first member and the second member, with each other, the first member and the second member configuring the second positioning device, and the one member being the member arranged at the body and being in a same state as the first positioning device after the adjustment.

9. The manufacturing method of the exposure apparatus according to claim 7, wherein
    the recessed section is a V groove, and the protruding section has a shape that comes in contact with a pair of slope faces of the V groove.

10. The manufacturing method of the exposure apparatus according to claim 9, wherein
    the protruding section makes line contact with the pair of slope faces of the V groove.

11. The manufacturing method of the exposure apparatus according to claim 1, wherein
    in the adjusting the first positioning device, three of the first positioning devices arranged corresponding to three positions of the body tool are adjusted.

12. The manufacturing method of the exposure apparatus according to claim 11, wherein
    in the docking, the body and the first module are docked with each other via three of the second positioning devices arranged corresponding to three positions of the body.

13. The manufacturing method of the exposure apparatus according to claim 1, wherein
    the first module is a stage module including a stage that holds the sensitive object.

14. A device manufacturing method, including:
    exposing a sensitive object using the exposure apparatus manufactured with the manufacturing method of the exposure apparatus according to claim 1; and
    developing the sensitive object that has been exposed.

15. A manufacturing method of an exposure apparatus to manufacture an exposure apparatus that comprises a plurality of modules including a body and a first module to be docked with the body and exposes a sensitive object, the method comprising:
    adjusting a first positioning device provided between a first module tool that is substantially a same member as the first module to be shipped and the body such that a positional relation between the first module tool and the body at the time of docking between them becomes a desired relation;

shipping the body whose positional relation at the time of the docking with the first module tool via the first positioning device after the adjustment becomes the desired relation; and docking the body and the first module with each other via a second positioning device having a same configuration as the first positioning device, at a destination of shipment, the second positioning device being in a same state as the first positioning device after the adjustment and being provided between the first module and the body.

16. The manufacturing method of the exposure apparatus according to claim 15, wherein
as the first module tool, the first module to be shipped is used.

17. The manufacturing method of the exposure apparatus according to claim 15, wherein
in the adjusting the first positioning device, the first positioning device is adjusted such that a positional relation between a first reference surface of the body and a second reference surface of the first module tool becomes a desired relation.

18. The manufacturing method of the exposure apparatus according to claim 17, wherein
the adjusting the first positioning device includes measuring a tilt between the first reference surface and the second reference surface and adjusting the first positioning device such that a tilt of the first module tool is adjusted.

19. The manufacturing method of the exposure apparatus according to claim 17, wherein
the adjusting the first positioning device includes measuring a rotational deviation between the first reference surface and the second reference surface and adjusting the first positioning device such that a rotation of the first module tool is adjusted.

20. The manufacturing method of the exposure apparatus according to claim 17, wherein
the adjusting the first positioning device includes measuring a positional deviation between the first reference surface and the second reference surface and adjusting the first positioning device such that a position of the first module tool is adjusted.

21. The manufacturing method of the exposure apparatus according to claim 15, wherein
the adjusting the first positioning device includes engaging a first member that is arranged at one of the body and the first module tool and has a recessed section formed thereon, and a second member that is arranged at the other of the body and the first module tool and has a protruding section, with each other, by engagement between the recessed section and the protruding section, and adjusting a position of one of the first member and the second member that is arranged at the first module tool with respect to the first module tool, the first member and the second member configuring the first positioning device.

22. The manufacturing method of the exposure apparatus according to claim 21, wherein
the docking includes engaging one member of the first member arranged at one of the body and the first module and the second member arranged at the other of the body and the first module, and the other member of the first member and the second member, with each other, the first member and the second member configuring the second positioning device, and the one member being the member arranged at the first module and being in a same state as the first positioning device after the adjustment.

23. The manufacturing method of the exposure apparatus according to claim 21, wherein
the recessed section is a V groove, and the protruding section has a shape that comes in contact with a pair of slope faces of the V groove.

24. The manufacturing method of the exposure apparatus according to claim 23, wherein
the protruding section makes line contact with the pair of slope faces of the V groove.

25. The manufacturing method of the exposure apparatus according to claim 15, wherein
in the adjusting the first positioning device, three of the first positioning devices arranged corresponding to three positions of the body are adjusted.

26. The manufacturing method of the exposure apparatus according to claim 25, wherein
in the docking, the body and the first module are docked with each other via three of the second positioning devices arranged corresponding to three positions of the body.

27. The manufacturing method of the exposure apparatus according to claim 15, wherein
the first module is a stage module including a stage that holds the sensitive object.

28. A device manufacturing method, including:
exposing a sensitive object using the exposure apparatus manufactured with the manufacturing method of the exposure apparatus according to claim 15; and
developing the sensitive object that has been exposed.

29. A manufacturing method of an exposure apparatus to manufacture an exposure apparatus that comprises a plurality of modules including a body and a first module to be docked with the body via a positioning device and exposes a sensitive object, the method comprising:
adjusting the positioning device that determines a positional relation between the body and the first module at the time of docking between them such that a positional relation between a first reference surface of the body and a second reference surface of the first module becomes a desired relation.

30. The manufacturing method of the exposure apparatus according to claim 29, wherein
the first module is a stage module including a stage that holds the sensitive object.

31. The manufacturing method of the exposure apparatus according to claim 29, wherein
the adjusting the positioning device includes measuring a tilt between the first reference surface and the second reference surface and adjusting the positioning device such that a tilt of the first module is adjusted.

32. The manufacturing method of the exposure apparatus according to claim 29, wherein
the adjusting the positioning device includes measuring a rotational deviation between the first reference surface and the second reference surface and adjusting the positioning device such that a rotation of the first module is adjusted.

33. The manufacturing method of the exposure apparatus according to claim 29, wherein
the adjusting the positioning device includes measuring a positional deviation between the first reference surface and the second reference surface and adjusting the positioning device such that a position of the first module is adjusted.

34. The manufacturing method of the exposure apparatus according to claim 29, wherein
the adjusting the positioning device includes engaging a first member that is arranged at one of the body and the first module and has a recessed section formed thereon, and a second member that is arranged at the other of the body and the first module and has a protruding section, with each other, by engagement between the recessed section and the protruding section, and adjusting a position of one of the first member and the second member that is arranged at the body with respect to the body, the first member and the second member configuring the positioning device.

35. The manufacturing method of the exposure apparatus according to claim 34, wherein
the recessed section is a V groove, and the protruding section has a shape that comes in contact with a pair of slope faces of the V groove.

36. The manufacturing method of the exposure apparatus according to claim 35, wherein
the protruding section makes line contact with the pair of slope faces of the V groove.

37. The manufacturing method of the exposure apparatus according to claim 29, wherein
in the adjusting the positioning device, three of the positioning devices arranged corresponding to three positions of the body are adjusted.

38. A device manufacturing method, including:
exposing a sensitive object using the exposure apparatus manufactured with the manufacturing method of the exposure apparatus according to claim 29; and
developing the sensitive object that has been exposed.

39. A manufacturing method of an exposure apparatus to manufacture an exposure apparatus that comprises a plurality of modules including a body and a first module to be docked with the body and exposes a sensitive object, the method comprising:
prior to docking, at a destination of shipment, the body and the first module with each other in a desired relation via a first positioning device provided between the body and the first module, docking a body tool that is substantially a same member as the body to be shipped and the first module with each other via a second positioning device having a same configuration as the first positioning device, and on the docking, adjusting the second positioning device provided between the body tool and the first module such that a positional relation between the body tool and the first module becomes the desired relation; and
shipping the first module after the adjustment.

40. The manufacturing method of the exposure apparatus according to claim 39, wherein
as the body tool, the body to be shipped is used.

41. The manufacturing method of the exposure apparatus according to claim 39, wherein
in the adjusting the second positioning device, the second positioning device is adjusted such that a positional relation between a first reference surface of the body tool and a second reference surface of the first module becomes a desired relation.

42. The manufacturing method of the exposure apparatus according to claim 41, wherein
the adjusting the second positioning device includes measuring a tilt between the first reference surface and the second reference surface and adjusting the second positioning device such that a tilt of the first module is adjusted.

43. The manufacturing method of the exposure apparatus according to claim 41, wherein
the adjusting the second positioning device includes measuring a rotational deviation between the first reference surface and the second reference surface and adjusting the second positioning device such that a rotation of the first module is adjusted.

44. The manufacturing method of the exposure apparatus according to claim 41, wherein
the adjusting the second positioning device includes measuring a positional deviation between the first reference surface and the second reference surface and adjusting the second positioning device such that a position of the first module is adjusted.

45. The manufacturing method of the exposure apparatus according to claim 39, wherein
the adjusting the second positioning device includes engaging a first member that is arranged at one of the body tool and the first module and has a recessed section formed thereon, and a second member that is arranged at the other of the body tool and the first module and has a protruding section, with each other, by engagement between the recessed section and the protruding section, and adjusting a position of one of the first member and the second member that is arranged at the body tool with respect to the body tool, the first member and the second member configuring the second positioning device.

46. The manufacturing method of the exposure apparatus according to claim 39, further comprising:
docking the body and the first module with each other via the first positioning device that is in a same state as the second positioning device after the adjustment, at the destination of shipment.

47. The manufacturing method of the exposure apparatus according to claim 39, further comprising:
prior to docking, at the destination of shipment, the body and the first module with each other in a desired relation via the first positioning device provided between the body and the first module,
docking a first module tool that is substantially a same member as the first module to be shipped and the body with each other via a third positioning device having a same configuration as the first positioning device, and on the docking, adjusting the third positioning device provided between the body and the first module tool such that a positional relation between the body and the first module tool becomes the desired relation; and
shipping the body after the adjustment.

48. The manufacturing method of the exposure apparatus according to claim 39, wherein
the first module is a stage module including a stage that holds the sensitive object.

49. A device manufacturing method, including:
exposing a sensitive object using the exposure apparatus manufactured with the manufacturing method of the exposure apparatus according to claim 39; and
developing the sensitive object that has been exposed.

50. A manufacturing method of an exposure apparatus to manufacture an exposure apparatus that comprises a plurality of modules including a body and a first module to be docked with the body and exposes a sensitive object, the method comprising:

docking the body and the first module with each other in a desired relation via a first positioning device provided between the body and the first module and adjusted in advance, wherein the first positioning device is adjusted in advance similarly to a second positioning device having a same configuration as the first positioning device and adjusted when a body tool that is substantially a same member as the body and the first module are docked with each other via the second positioning device such that a positional relation between the body tool and the first module becomes the desired relation.

51. The manufacturing method of the exposure apparatus according to claim 50, wherein the body tool is substantially a same member as the body that is delivered to a device manufacturing plant where docking between the body and the first module via the first positioning device is performed.

52. The manufacturing method of the exposure apparatus according to claim 50, wherein the first module is a stage module including a stage that holds the sensitive object.

53. A device manufacturing method, including:

exposing a sensitive object using the exposure apparatus manufactured with the manufacturing method of the exposure apparatus according to claim 50; and developing the sensitive object that has been exposed.

54. A manufacturing method of an exposure apparatus to manufacture an exposure apparatus that comprises a plurality of modules including a body and a first module to be docked with the body and exposes a sensitive object, the method comprising:

prior to docking, at a destination of shipment, the body and the first module with each other in a desired relation via a first positioning device provided between the body and the first module, docking a first module tool that is substantially a same member as the first module to be shipped and the body with each other via a second positioning device having a same configuration as the first positioning device, and on the docking, adjusting the second positioning device provided between the first module tool and the body such that a positional relation between the body and the first module tool becomes the desired relation; and shipping the body after the adjustment.

55. The manufacturing method of the exposure apparatus according to claim 54, wherein as the first module tool, the first module to be shipped is used.

56. The manufacturing method of the exposure apparatus according to claim 54, wherein in the adjusting the second positioning device, the second positioning device is adjusted such that a positional relation between a first reference surface of the body and a second reference surface of the first module tool becomes a desired relation.

57. The manufacturing method of the exposure apparatus according to claim 56, wherein the adjusting the second positioning device includes measuring a tilt between the first reference surface and the second reference surface and adjusting the second positioning device such that a tilt of the first module tool is adjusted.

58. The manufacturing method of the exposure apparatus according to claim 56, wherein the adjusting the second positioning device includes measuring a rotational deviation between the first reference surface and the second reference surface and adjusting the second positioning device such that a rotation of the first module tool is adjusted.

59. The manufacturing method of the exposure apparatus according to claim 56, wherein the adjusting the second positioning device includes measuring a positional deviation between the first reference surface and the second reference surface and adjusting the second positioning device such that a position of the first module tool is adjusted.

60. The manufacturing method of the exposure apparatus according to claim 54, wherein the adjusting the second positioning device includes engaging a first member that is arranged at one of the body and the first module tool and has a recessed section formed thereon, and a second member that is arranged at the other of the body and the first module tool and has a protruding section, with each other, by engagement between the recessed section and the protruding section, and adjusting a position of one of the first member and the second member that is arranged at the first module tool with respect to the first module tool, the first member and the second member configuring the second positioning device.

61. The manufacturing method of the exposure apparatus according to claim 54, further comprising:

docking the body and the first module with each other via the first positioning device that is in a same state as the second positioning device after the adjustment, at the destination of shipment.

62. The manufacturing method of the exposure apparatus according to claim 54, further comprising:

prior to docking, at the destination of shipment, the body and the first module with each other in a desired relation via the first positioning device provided between the body and the first module, docking a body tool that is substantially a same member as the body to be shipped and the first module with each other via a third positioning device having a same configuration as the first positioning device, and on the docking, adjusting the third positioning device provided between the body tool and the first module such that a positional relation between the body tool and the first module becomes the desired relation; and shipping the first module after the adjustment.

63. The manufacturing method of the exposure apparatus according to claim 54, wherein the first module is a stage module including a stage that holds the sensitive object.

64. A device manufacturing method, including:

exposing a sensitive object using the exposure apparatus manufactured with the manufacturing method of the exposure apparatus according to claim 54; and developing the sensitive object that has been exposed.

65. A manufacturing method of an exposure apparatus to manufacture an exposure apparatus that comprises a plurality of modules including a body and a first module to be docked with the body and exposes a sensitive object, the method comprising:

docking the body and the first module with each other in a desired relation via a first positioning device provided between the body and the first module and adjusted in advance, wherein the first positioning device is adjusted in advance similarly to a second positioning device having a same configuration as the first positioning device and adjusted when a first module tool that is substantially a same member as the first module and the body are docked with each other via the second positioning device such that a positional relation between the first module tool and the body becomes the desired relation.

66. The manufacturing method of the exposure apparatus according to claim 65, wherein the first module tool is substantially a same member as the first module that is delivered to a device manufacturing plant where docking between the body and the first module via the first positioning device is performed.

67. The manufacturing method of the exposure apparatus according to claim 65, wherein the first module is a stage module including a stage that holds the sensitive object.

68. A device manufacturing method, including:

exposing a sensitive object using the exposure apparatus manufactured with the manufacturing method of the exposure apparatus according to claim 65; and developing the sensitive object that has been exposed.

* * * * *